(12) United States Patent
Yagi et al.

(10) Patent No.: US 11,759,913 B2
(45) Date of Patent: Sep. 19, 2023

(54) POLISHING METHOD AND POLISHING APPARATUS

(71) Applicant: EBARA CORPORATION, Tokyo (JP)

(72) Inventors: Keita Yagi, Tokyo (JP); Yoichi Shiokawa, Tokyo (JP); Toshimitsu Sasaki, Tokyo (JP); Yuki Watanabe, Tokyo (JP); Nachiketa Chauhan, Tokyo (JP)

(73) Assignee: EBARA CORPORATION, Tokyo (JP)

( * ) Notice: Subject to any disclaimer, the term of this patent is extended or adjusted under 35 U.S.C. 154(b) by 299 days.

(21) Appl. No.: 17/110,797

(22) Filed: Dec. 3, 2020

(65) Prior Publication Data

US 2021/0170544 A1    Jun. 10, 2021

(30) Foreign Application Priority Data

Dec. 10, 2019  (JP) ................... 2019-222892

(51) Int. Cl.
*B24B 49/12* (2006.01)
*B24B 37/013* (2012.01)
*H01L 21/304* (2006.01)

(52) U.S. Cl.
CPC ............ *B24B 49/12* (2013.01); *B24B 37/013* (2013.01); *H01L 21/304* (2013.01)

(58) Field of Classification Search
CPC ......... B24B 49/12; B24B 49/10; B24B 49/02; B24B 49/03; B24B 37/013; B24B 37/107; B24B 37/005; B24B 37/042; B24B 37/04; B24B 37/07; B24B 37/10; B24B 57/02; B24B 7/228; H01L 21/304; H01L 21/67092; H01L 22/12; G06K 9/6218; G06N 3/045; G06N 3/08

USPC .................................................. 451/6
See application file for complete search history.

(56) References Cited

U.S. PATENT DOCUMENTS

| | | | | |
|---|---|---|---|---|
| 2011/0275167 A1* | 11/2011 | David | ............... | H01L 22/26 257/E21.528 |
| 2015/0017887 A1* | 1/2015 | Kobayashi | ............ | B24B 37/013 451/73 |
| 2015/0183084 A1* | 7/2015 | Ito | ............... | B24B 37/013 451/6 |
| 2015/0332943 A1* | 11/2015 | Kobata | ............... | B24B 37/013 156/345.13 |

(Continued)

FOREIGN PATENT DOCUMENTS

JP   H05-128256 A    5/1993
JP   H05-342310 A    12/1993

(Continued)

*Primary Examiner* — Joel D Crandall
*Assistant Examiner* — Michael A Gump
(74) *Attorney, Agent, or Firm* — BakerHostetler

(57) ABSTRACT

A substrate polishing method capable of reducing an influence of variation in spectrum of reflected light from a substrate, such as a wafer, and determining an accurate film thickness is disclosed. The method includes: polishing a surface of a substrate by pressing the substrate against a polishing pad on a rotating polishing table; producing a spectrum of reflected light from the surface of the substrate each time the polishing table makes one rotation; creating a three-dimensional data containing a plurality of spectra arranged along polishing time; and determining a film thickness of the substrate based on the three-dimensional data.

2 Claims, 21 Drawing Sheets

(56) References Cited

U.S. PATENT DOCUMENTS

2017/0190020 A1\* 7/2017 Kobayashi .............. B24B 49/04

FOREIGN PATENT DOCUMENTS

| JP | 2006-254226 A | 9/2006 |
| JP | 2014-512693 A | 5/2014 |
| WO | WO 2012/145418 A2 | 10/2012 |

\* cited by examiner

POLISHING METHOD AND POLISHING APPARATUS

CROSS REFERENCE TO RELATED APPLICATION

This document claims priority to Japanese Patent Application Number 2019-222892 filed Dec. 10, 2019, the entire contents of which are hereby incorporated by reference.

BACKGROUND

In a manufacturing process of a semiconductor device, various materials are repeatedly formed in film shapes on a silicon wafer to form a multilayer structure. In order to form such multilayer structure, a technique of planarizing a surface of an uppermost layer of the multilayer structure is becoming important. Chemical mechanical polishing (CMP) is used as one of such planarizing techniques.

The chemical mechanical polishing (CMP) is performed by a polishing apparatus. This type of polishing apparatus generally includes a polishing table that supports a polishing pad, a polishing head configured to hold a substrate (for example, a wafer having a film), and a polishing-liquid supply nozzle configured to supply a polishing liquid (for example, slurry) onto the polishing pad. When a substrate is to be polished, the surface of the substrate is pressed against the polishing pad by the polishing head while the polishing liquid is supplied onto the polishing pad from the polishing-liquid supply nozzle. The polishing head and the polishing table are rotated to move the substrate and the polishing pad relative to each other, thereby polishing a film forming the surface of the substrate.

In order to measure a thickness of a non-metal film, such as a dielectric film or a silicon layer, the polishing apparatus generally includes an optical film-thickness measuring device. This optical film-thickness measuring device is configured to direct light, emitted by a light source, to the surface of the substrate and analyze a spectrum of reflected light from the substrate to determine a film thickness of the substrate.

FIG. 22 is a diagram illustrating an example of a conventional method of determining the film thickness from the spectrum of reflected light. The optical film-thickness measuring device measures intensity of the reflected light from the substrate with a spectrometer during polishing of the substrate, and generates a spectrum of the reflected light. The spectrum is expressed as a graph showing a relationship between intensity of the reflected light and wavelength of the reflected light. The optical film-thickness measuring device compares the spectrum of the reflected light with a plurality of reference spectra, and determines one reference spectrum whose shape is most similar to the spectrum of the reflected light. Specifically, the optical film-thickness measuring device calculates a difference between the spectrum of the reflected light and each of the reference spectra, and determines a reference spectrum with the smallest calculated difference. The optical film-thickness measuring device then determines a film thickness associated with the determined reference spectrum.

Each one of the reference spectra is associated with a film thickness in advance when that reference spectrum was obtained. Specifically, the plurality of reference spectra were obtained at different film thicknesses, and these plurality of reference spectra correspond to the different film thicknesses. Therefore, a current film thickness of a substrate being polished can be determined by identifying a reference spectrum having a shape closest to the spectrum of reflected light.

However, the spectrum obtained during polishing of the substrate is likely to vary due to various causes. For example, the spectrum of reflected light obtained during polishing may change significantly due to disturbances (e.g., slurry, electrical noise, optical noise, etc.), difference in pattern structure, difference in structure lying beneath a film, and the like. Therefore, the film thickness determined from the spectrum may differ significantly from an actual film thickness.

SUMMARY OF THE INVENTION

Therefore, there are provided a substrate polishing method and a substrate polishing apparatus capable of reducing an influence of variation in spectrum of reflected light from a substrate, such as a wafer, and determining an accurate film thickness.

Embodiments, which will be described below, relate to a method and an apparatus for polishing a substrate, such as a wafer, and more particularly to a technique for determining a film thickness based on optical information contained in reflected light from the substrate.

In an embodiment, there is provided a polishing method comprising: polishing a surface of a substrate by pressing the substrate against a polishing pad on a rotating polishing table; producing a spectrum of reflected light from the surface of the substrate each time the polishing table makes one rotation; creating a three-dimensional data containing a plurality of spectra arranged along polishing time; and determining a film thickness of the substrate based on the three-dimensional data.

In an embodiment, determining the film thickness of the substrate comprises: comparing the three-dimensional data with a reference data containing a plurality of reference spectra arranged along polishing time; determining a position of a data area in the reference data that best matches the three-dimensional data; and determining the film thickness associated with the determined position.

In an embodiment, comparing the three-dimensional data with the reference data comprises calculating a difference between the plurality of spectra contained in the three-dimensional data and the plurality of reference spectra contained in the reference data, and determining the position of the data area in the reference data that best matches the three-dimensional data comprises determining the position of the data area at which the difference is minimized.

In an embodiment, the polishing method further comprises selecting, from a plurality of reference data, the reference data including a data area that best matches an initial three-dimensional data created at an initial stage of polishing of the substrate, each of the plurality of reference data including a plurality of reference spectra produced when one of a plurality of prepared reference substrates is polished.

In an embodiment, determining the film thickness of the substrate comprises: converting the reference data and the three-dimensional data into a reference image and a two-dimensional image, respectively; determining a position of an image area in the reference image that best matches the two-dimensional image; and determining the film thickness associated with the determined position.

In an embodiment, the polishing method further comprises: converting a plurality of reference data into a plurality of reference images, the plurality of reference data including a plurality of reference spectra produced when a plurality of prepared reference substrates are polished; converting an initial three-dimensional data into an initial two-dimensional image, the initial three-dimensional data being created at an initial stage of polishing of the substrate; and selecting, from the plurality of reference images, the reference image including an image area that best matches the initial two-dimensional image.

In an embodiment, determining the film thickness of the substrate comprises: inputting the three-dimensional data into a film-thickness calculation model that has been constructed according to an artificial intelligence algorithm; and outputting the film thickness from the film-thickness calculation model.

In an embodiment, the film-thickness calculation model is a trained model that has been constructed with use of a training data set containing a combination of a plurality of training three-dimensional data and a plurality of film thicknesses associated with the plurality of training three-dimensional data, respectively, and each of the plurality of training three-dimensional data includes a plurality of reference spectra arranged along polishing time.

In an embodiment, the film-thickness calculation model is the trained model obtained by: creating the plurality of training three-dimensional data each containing a plurality of reference spectra produced when a plurality of reference substrates are polished; dividing the plurality of training three-dimensional data into a plurality of groups according to a clustering algorithm; creating test three-dimensional data by arranging a plurality of spectra along polishing time, the plurality of spectra of the test three-dimensional data being produced when a test substrate is polished; selecting, from the plurality of groups, one group including a training three-dimensional data that best matches the test three-dimensional data; and constructing the film-thickness calculation model with use of the training data set containing the combination of the plurality of training three-dimensional data belonging to the selected group and the plurality of film thicknesses associated with the plurality of training three-dimensional data, respectively.

In an embodiment, there is provided a polishing apparatus comprising: a polishing table for supporting a polishing pad, the polishing table being rotatable; a polishing head configured to press a substrate against the polishing pad to polish a surface of the substrate; a sensor head located in the polishing table, the sensor head being configured to direct light to the surface of the substrate and receive reflected light from the surface of the substrate; and a processing system having a memory storing therein a program configured to cause the processing system to produce a spectrum of the reflected light, create a three-dimensional data containing a plurality of spectra arranged along polishing time, and determine a film thickness of the substrate based on the three-dimensional data.

In an embodiment, the processing system is configured to: compare the three-dimensional data with a reference data containing a plurality of reference spectra arranged along polishing time; determine a position of a data area in the reference data that best matches the three-dimensional data; and determine the film thickness associated with the determined position.

In an embodiment, the processing system is configured to: calculate a difference between the plurality of spectra contained in the three-dimensional data and the plurality of reference spectra contained in the reference data; and determine the position of the data area at which the difference is minimized.

In an embodiment, the processing system is configured to select, from a plurality of reference data, the reference data including a data area that best matches an initial three-dimensional data created at an initial stage of polishing of the substrate, each of the plurality of reference data including a plurality of reference spectra produced when one of a plurality of prepared reference substrates is polished.

In an embodiment, the processing system is configured to: convert the reference data and the three-dimensional data into a reference image and a two-dimensional image, respectively; determine a position of an image area in the reference image that best matches the two-dimensional image; and determine the film thickness associated with the determined position.

In an embodiment, the processing system is configured to: convert a plurality of reference data into a plurality of reference images, the plurality of reference data including a plurality of reference spectra produced when a plurality of prepared reference substrates are polished; convert an initial three-dimensional data into an initial two-dimensional image, the initial three-dimensional data being created at an initial stage of polishing of the substrate; and select, from the plurality of reference images, the reference image including an image area that best matches the initial two-dimensional image.

In an embodiment, the memory stores therein a film-thickness calculation model that has been constructed according to an artificial intelligence algorithm, and the processing system is configured to input the three-dimensional data into the film-thickness calculation model, and output the film thickness from the film-thickness calculation model.

In an embodiment, the film-thickness calculation model is a trained model that has been constructed with use of a training data set containing a combination of a plurality of training three-dimensional data and a plurality of film thicknesses associated with the plurality of training three-dimensional data, respectively, and each of the plurality of training three-dimensional data includes a plurality of reference spectra arranged along polishing time.

In an embodiment, the film-thickness calculation model is the trained model obtained by: creating the plurality of training three-dimensional data each containing a plurality of reference spectra produced when a plurality of reference substrates are polished; dividing the plurality of training three-dimensional data into a plurality of groups according to a clustering algorithm; creating test three-dimensional data by arranging a plurality of spectra along polishing time, the plurality of spectra of the test three-dimensional data being produced when a test substrate is polished; selecting, from the plurality of groups, one group including a training three-dimensional data that best matches the test three-dimensional data; and constructing the film-thickness calculation model with use of the training data set containing the combination of the plurality of training three-dimensional data belonging to the selected group and the plurality of film thicknesses associated with the plurality of training three-dimensional data, respectively.

According to the above-described embodiments, the film thickness of the substrate is determined not based on one spectrum but based on three-dimensional data including time-series spectra. Therefore, even if the three-dimensional data contains a spectrum having a significantly different shape, the influence of such a spectrum on the film thickness determination is reduced. As a result, the film thickness of the substrate can be accurately determined.

DESCRIPTION OF EMBODIMENTS

Embodiments will be described below with reference to the drawings.

Figure 1:
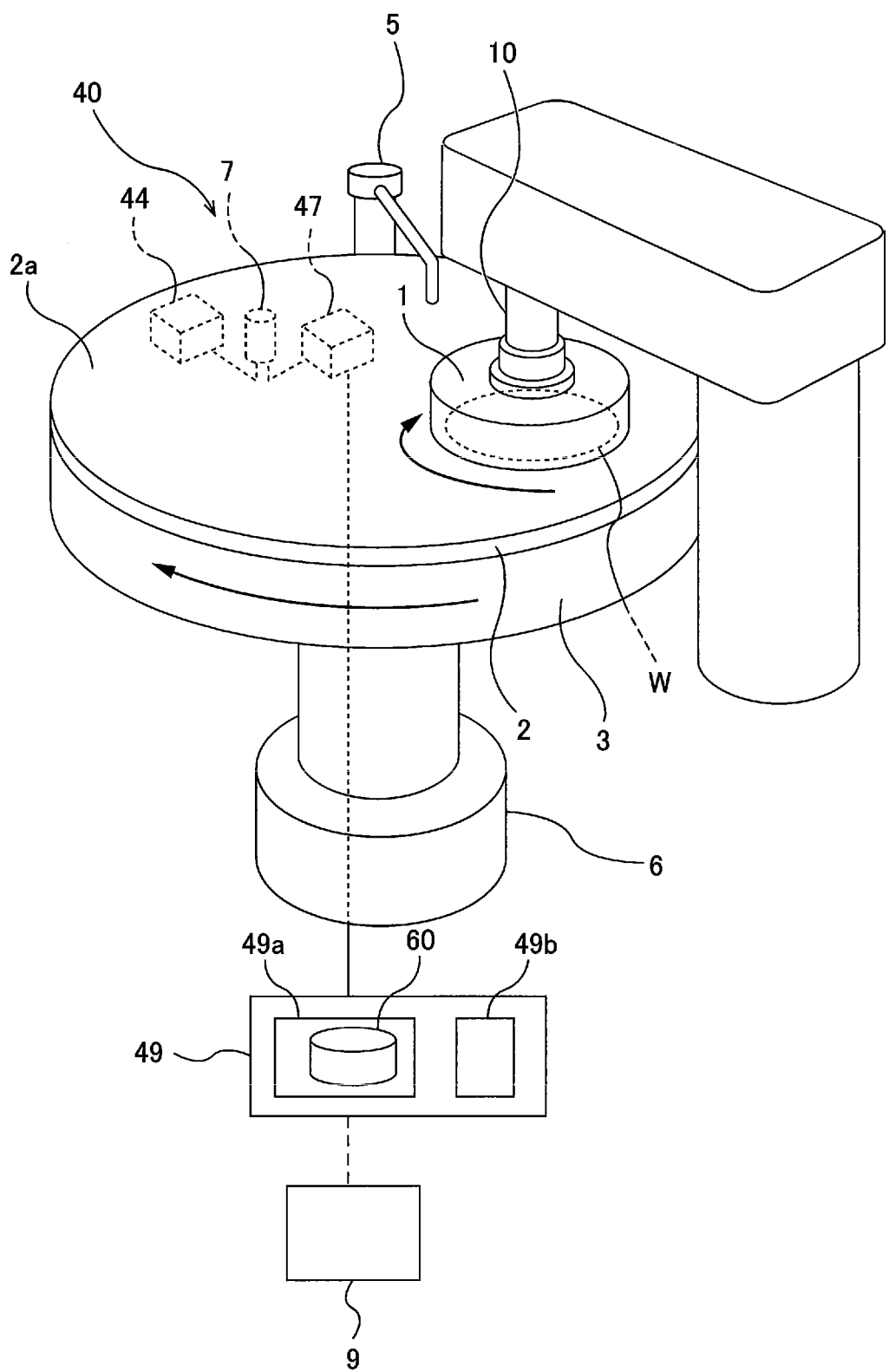
FIG. 1 is a schematic view showing an embodiment of a polishing apparatus.

FIG. 1 is schematic view showing an embodiment of a polishing apparatus. As shown in FIG. 1, the polishing apparatus includes a polishing table 3 for supporting a polishing pad 2, a polishing head 1 configured to press a substrate W, such as a wafer, against the polishing pad 2, a table motor 6 configured to rotate the polishing table 3, and a polishing-liquid supply nozzle 5 arranged to supply a polishing liquid (e.g., slurry) onto the polishing pad 2. The polishing pad 2 has an upper surface constituting a polishing surface 2a for polishing the substrate W.

The polishing head 1 is coupled to a head shaft 10, which is coupled to a polishing-head motor (now shown). The polishing-head motor is configured to rotate the polishing head 1 together with the head shaft 10 in a direction indicated by an arrow. The polishing table 3 is coupled to the table motor 6, which is configured to rotate the polishing table 3 and the polishing pad 2 in a direction indicated by an arrow.

Polishing of the substrate W is performed as follows. The polishing-liquid supply nozzle 5 supplies the polishing liquid onto the polishing surface 2a of the polishing pad 2 on the polishing table 3, while the polishing table 3 and the polishing head 1 are rotated in directions indicated by the arrows in FIG. 1. While the substrate W is being rotated by the polishing head 1, the substrate W is pressed by the polishing head 1 against the polishing surface 2a of the polishing pad 2 in the presence of the polishing liquid on the polishing pad 2. The surface of the substrate W is polished by a chemical action of the polishing liquid and a mechanical action of abrasive grains contained in the polishing liquid.

The polishing apparatus includes an optical film-thickness measuring device 40 configured to determine a film thickness of the substrate W. The optical film-thickness measuring device 40 includes a light source 44 for emitting light, a spectrometer 47, an optical sensor head 7 coupled to the light source 44 and the spectrometer 47, and a processing system 49 coupled to the spectrometer 47. The optical sensor head 7, the light source 44, and the spectrometer 47 are secured to the polishing table 3, and rotate together with the polishing table 3 and the polishing pad 2. The position of the optical sensor head 7 is such that the optical sensor head 7 sweeps across the surface of the substrate W on the polishing pad 2 each time the polishing table 3 and the polishing pad 2 make one rotation.

The processing system 49 includes a memory 49a storing programs therein for generating a spectrum and determining a film thickness of the substrate W, which will be described later, and a processor 49b for performing arithmetic operations according to instructions included in the program. The processing system 49 is composed of at least one computer. The memory 49a includes a main memory, such as RAM, and an auxiliary memory, such as a hard disk drive (HDD) or a solid state drive (SSD). Examples of the processor 49b include a CPU (central processing unit) and a GPU (graphic processing unit). However, the specific configurations of the processing system 49 are not limited to these examples.

The light emitted by the light source 44 is transmitted to the optical sensor head 7, which directs the light to the surface of the substrate W. The light is reflected off the surface of the substrate W, and the reflected light from the substrate W is received by the optical sensor head 7 and is further transmitted to the spectrometer 47. The spectrometer 47 decomposes the reflected light according to wavelength, and measures an intensity of the reflected light at each of wavelengths. The intensity measurement data of the reflected light is transmitted to the processing system 49.

The processing system 49 is configured to produce a spectrum of the reflected light from the intensity measurement data of the reflected light. This spectrum of the reflected light is expressed as a line graph (i.e., a spectral waveform) indicating a relationship between the wavelength and the intensity of the reflected light. The intensity of the reflected light can also be represented by a relative value, such as a reflectance or a relative reflectance.

Figure 2:
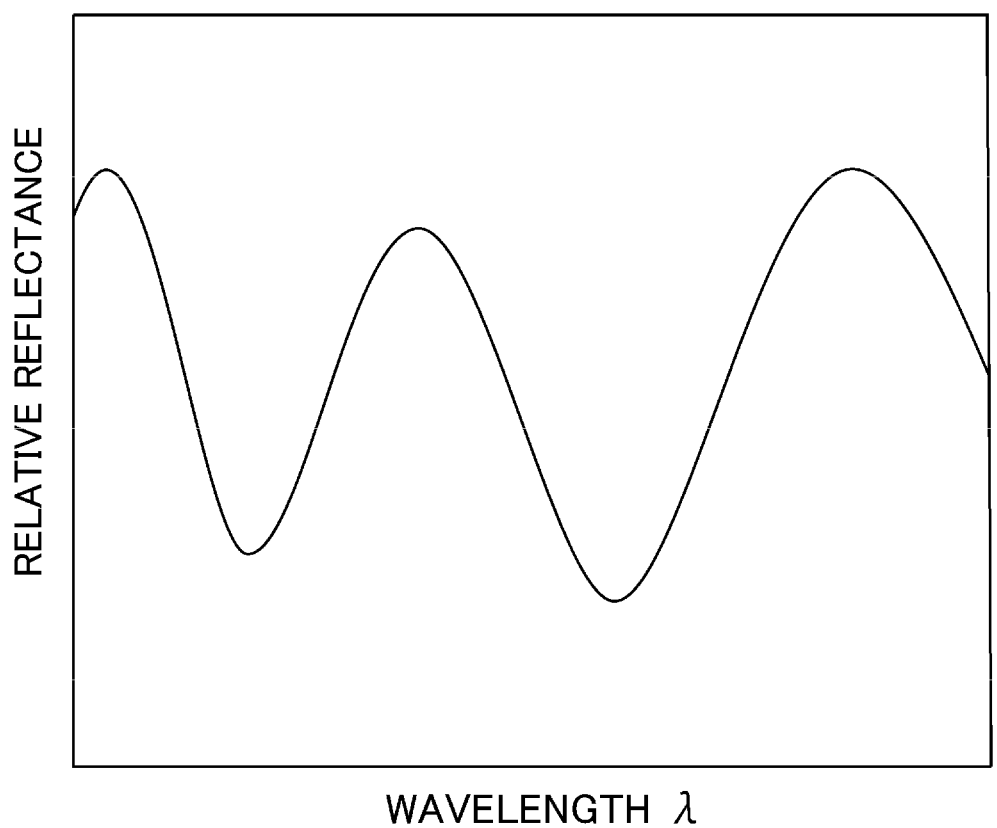
FIG. 2 is a diagram showing a spectrum generated by a spectrum processing device.

FIG. 2 is a diagram showing an example of a spectrum created by the processing system 49. The spectrum is represented as a line graph (i.e., a spectral waveform) showing the relationship between the wavelength and intensity of light. In FIG. 2, horizontal axis represents wavelength of the light reflected from the substrate, and vertical axis represents relative reflectance derived from the intensity of the reflected light. The relative reflectance is an index value that represents the intensity of the reflected light. Specifically, the relative reflectance is a ratio of the intensity of the light to a predetermined reference intensity. By dividing the intensity of the light (i.e., the actually measured intensity) at each wavelength by a predetermined reference intensity, unwanted noises, such as a variation in the intensity inherent in an optical system or the light source of the apparatus, are removed from the actually measured intensity.

The reference intensity is an intensity that has been measured in advance at each of the wavelengths. The relative reflectance is calculated at each of the wavelengths. Specifically, the relative reflectance is determined by dividing the intensity of the light (the actually measured intensity) at each wavelength by the corresponding reference intensity. The reference intensity is, for example, obtained by directly measuring the intensity of light emitted from the optical sensor head 7, or by irradiating a mirror with light from the optical sensor head 7 and measuring the intensity of reflected light from the mirror. Alternatively, the reference intensity may be an intensity of the reflected light which is measured by the spectrometer 47 when a silicon substrate (bare substrate) with no film thereon is being water-polished in the presence of water on the polishing pad 2, or when the silicon substrate (bare substrate) is placed on the polishing pad 2.

In the actual polishing process, a dark level (which is a background intensity obtained under the condition that light is cut off) is subtracted from the actually measured intensity to determine a corrected actually measured intensity. Further, the dark level is subtracted from the reference intensity to determine a corrected reference intensity. Then the relative reflectance is calculated by dividing the corrected actually measured intensity by the corrected reference intensity. Specifically, the relative reflectance $R(\lambda)$ can be calculated by using the following formula (1)

$$R(\lambda) = \frac{E(\lambda) - D(\lambda)}{B(\lambda) - D(\lambda)} \quad (1)$$

where $\lambda$ is wavelength, $E(\lambda)$ is the intensity of the light reflected from the wafer at the wavelength $\lambda$, $B(\lambda)$ is the reference intensity at the wavelength $\lambda$, and $D(\lambda)$ is the background intensity (i.e., dark level) at the wavelength $\lambda$ obtained under the condition that light is cut off.

Each time the polishing table 3 makes one rotation, the optical sensor head 7 directs the light to a predetermined measurement point on the substrate W and receives the reflected light from the predetermined measurement point. The reflected light is transmitted to the spectrometer 47. The spectrometer 47 decomposes the reflected light according to wavelength and measures the intensity of the reflected light at each of wavelengths. The intensity measurement data of the reflected light is sent to the processing system 49, which produces a spectrum, as shown in FIG. 2, from the intensity measurement data of the reflected light. In the example shown in FIG. 2, the spectrum of the reflected light is a spectral waveform showing the relationship between the relative reflectance and the wavelength of the reflected light. The spectrum of the reflected light may be a spectral waveform showing a relationship between the intensity itself of the reflected light and the wavelength of the reflected light.

Further, as will be described later, the processing system 49 receives the intensity measurement data of the reflected light returned from the predetermined measurement point while the polishing table 3 rotates a plurality of times, and generates a plurality of spectra from the intensity measurement data. Then, the processing system 49 produces three-dimensional data by arranging these spectra along polishing time. The processing system 49 is configured to determine a film thickness of the substrate W using the three-dimensional data.

As shown in FIG. 1, the memory 49a of the processing system 49 has a database 60 containing data of a plurality of reference spectra. The plurality of reference spectra are spectra of reflected light from a plurality of substrates that have been polished previously, in other words, spectra of reflected light produced when substrates other than the substrate W were polished. In the following descriptions, a substrate used to produce a reference spectrum is referred to as a reference substrate.

The processing system 49 is composed of at least one computer. The at least one computer may be one server or a plurality of servers. The processing system 49 may be an edge server coupled to the spectrometer 47 by a communication line, or may be a cloud server or a fog server coupled to the spectrometer 47 by a communication network, such as the Internet or a local area network. The processing system 49 may be arranged in a gateway, a router, or the like.

The processing system 49 may be a plurality of servers coupled by a communication network, such as the Internet or a local area network. For example, the processing system 49 may be a combination of an edge server and a cloud server. In one embodiment, the database 60 may be provided in a data server (not shown) located away from the processor 49b.

Figure 3A:
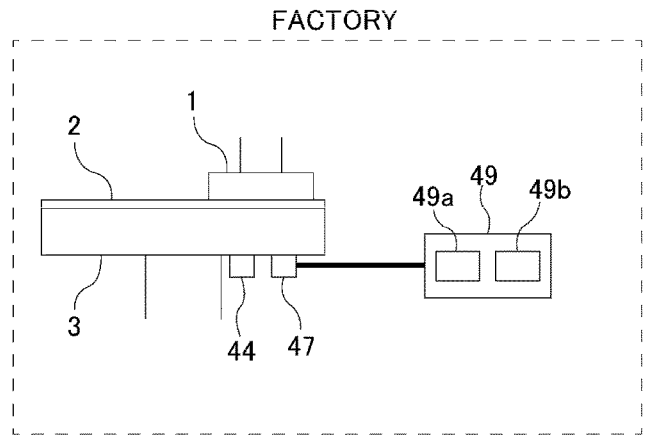
FIGS. 3A to 3C are schematic views each showing an example of a processing system.
Figure 3B:
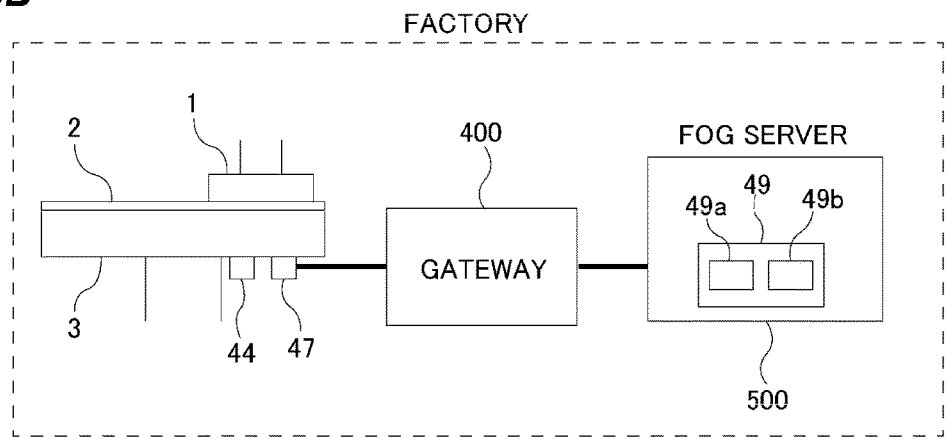
Figure 3C:
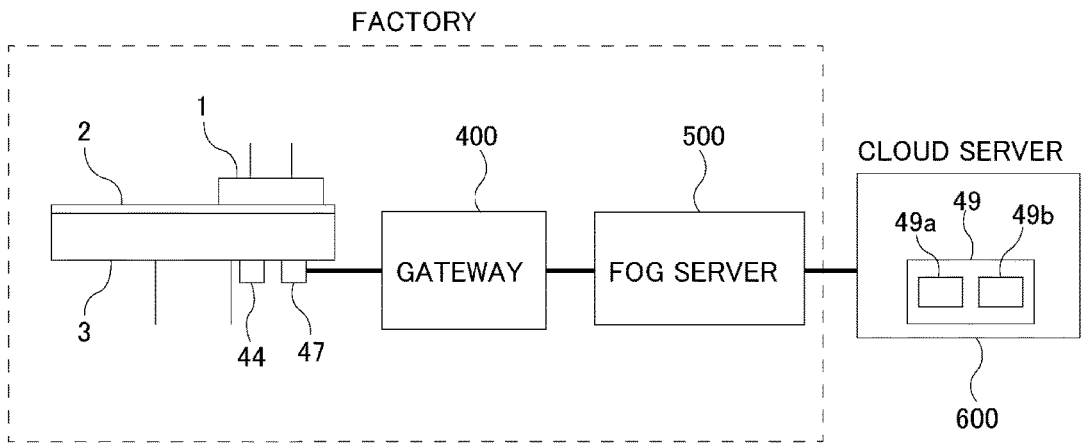

FIGS. 3A to 3C are schematic views each showing an example of the processing system 49. FIG. 3A shows an example in which the entire processing system 49 is provided as a controller arranged in a factory where the polishing table 3 and the polishing head 1 are installed. In this example, the processing system 49 constitutes one apparatus together with the polishing table 3 and the polishing head 1.

FIG. 3B shows an example in which the processing system 49 is provided in a fog server 500 disposed in a factory. The fog server 500 is coupled to the spectrometer 47 through a gateway 400. An example of the gateway 400 is a communication connecting device, such as a router. The gateway 400 may be coupled to the spectrometer 47 and/or the fog server 500 by wire, or may be wirelessly coupled to the spectrometer 47 and/or the fog server 500. In one embodiment, the processing system 49 may be provided within the gateway 400. The embodiment in which the processing system 49 is provided in the gateway 400 is suitable for high-speed processing of the intensity measurement data of the reflected light sent from the spectrometer 47. On the other hand, the embodiment in which the processing system 49 is provided in the fog server 500 may be used when high-speed processing is not required. In one embodiment, a plurality of computers constituting the processing system 49 may be provided in both the gateway 400 and the fog server 500.

FIG. 3C shows an example in which the processing system 49 is provided in a cloud server 600 provided outside the factory. The cloud server 600 is coupled to the spectrometer 47 via a fog server 500 and a gateway 400. The fog server 500 may be omitted. The embodiment shown in FIG. 3C is suitable when a plurality of polishing apparatuses are coupled to the cloud server 600 by a communication network and the processing system 49 processes a large amount of data.

Returning back to FIG. 1, the processing system 49 is coupled to a polishing controller 9 for controlling polishing operation for the substrate W. The polishing controller 9 is configured to control the polishing operation for the substrate W based on the film thickness of the substrate W determined by the processing system 49. For example, the polishing controller 9 is configured to determine a polishing end point when the film thickness of the substrate W reaches a target film thickness, or change polishing conditions of the substrate W when the film thickness of the substrate W reaches a predetermined value.

Figure 4:
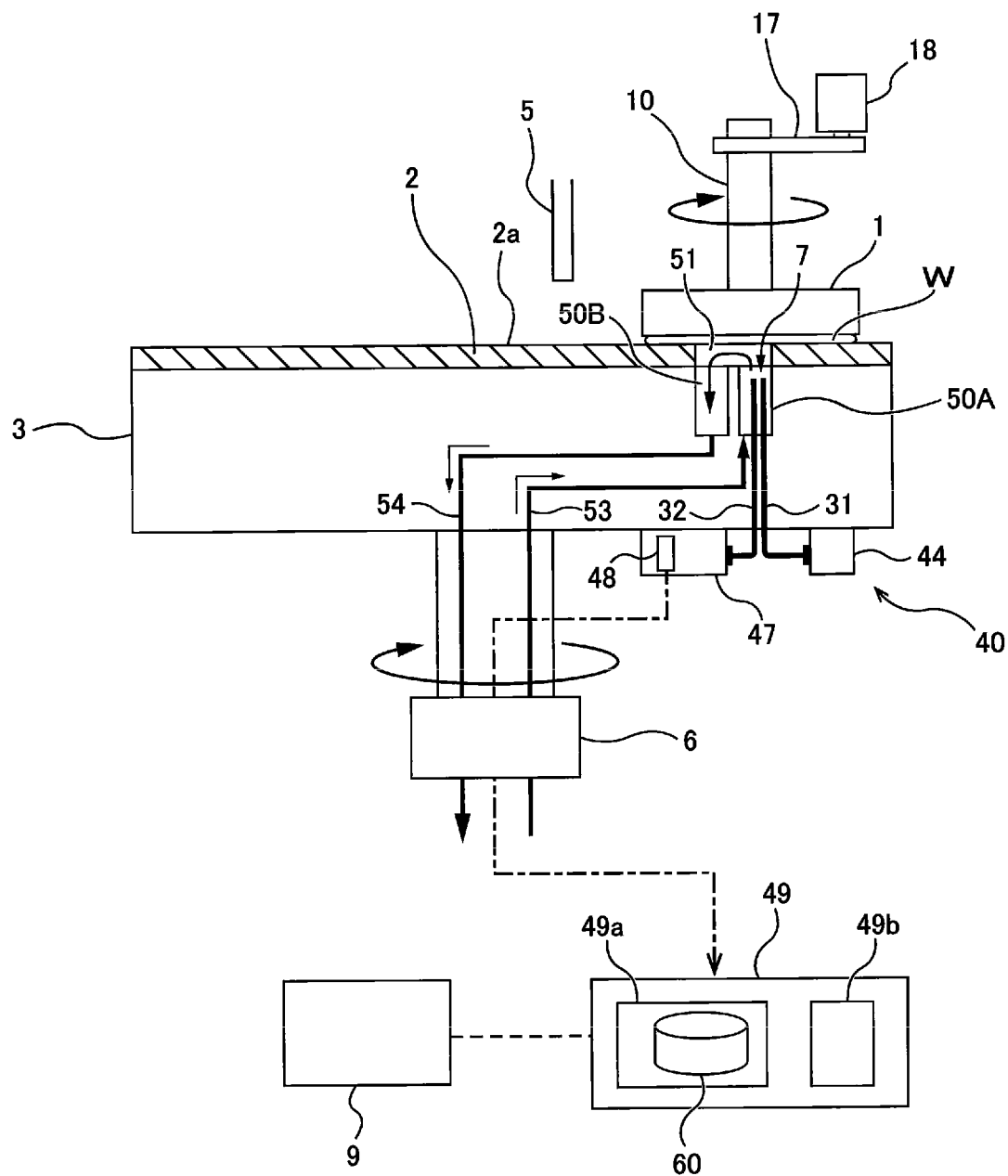
FIG. 4 is a cross-sectional view showing an embodiment of a detailed configuration of the polishing apparatus shown in FIG. 1.

FIG. 4 is a cross-sectional view showing an embodiment of detailed configurations of the polishing apparatus shown in FIG. 1. The head shaft 10 is coupled to a polishing-head motor 18 through a coupling device 17, such as belt, so that the head shaft 10 is rotated by the polishing-head motor 18. This rotation of the head shaft 10 is transmitted to the polishing head 1 to rotate the polishing head 1 in the direction indicated by the arrow.

The spectrometer 47 includes a light detector 48. In one embodiment, the light detector 48 is constituted by photodiode, CCD, or CMOS. The optical sensor head 7 is optically coupled to the light source 44 and the light detector 48. The light detector 48 is electrically coupled to the processing system 49.

The optical film-thickness measuring device 40 further includes a light-emitting optical fiber cable 31 arranged to direct the light, emitted by the light source 44, to the surface of the substrate W, and a light-receiving optical fiber cable 32 arranged to receive the reflected light from the substrate W and transmit the reflected light to the spectrometer 47. An end of the light-emitting optical fiber cable 31 and an end of the light-receiving optical fiber cable 32 are located in the polishing table 3.

The end of the light-emitting optical fiber cable 31 and the end of the light-receiving optical fiber cable 32 constitute the optical sensor head 7 that directs the light to the surface of the substrate W and receives the reflected light from the substrate W. The other end of the light-emitting optical fiber cable 31 is coupled to the light source 44, and the other end of the light-receiving optical fiber cable 32 is coupled to the spectrometer 47. The spectrometer 47 is configured to decompose the reflected light from the substrate W according to wavelength and measure intensities of the reflected light over a predetermined wavelength range.

The light source 44 transmits the light to the optical sensor head 7 through the light-emitting optical fiber cable 31, and the optical sensor head 7 emits the light to the substrate W. The reflected light from the substrate W is received by the optical sensor head 7 and transmitted to the spectrometer 47 through the light-receiving optical fiber cable 32. The spectrometer 47 decomposes the reflected light according to its wavelength and measures the intensity of the reflected light at each of the wavelengths. The spectrometer 47 sends the intensity measurement data of the reflected light to the processing system 49. The processing system 49 produces the spectrum of the reflected light from the intensity measurement data of the reflected light.

The polishing table 3 has a first hole 50A and a second hole 50B which open in an upper surface of the polishing table 3. The polishing pad 2 has a through-hole 51 at a position corresponding to the holes 50A and 50B. The holes 50A and 50B are in fluid communication with the through-hole 51, which opens in the polishing surface 2a. The first hole 50A is coupled to a liquid supply line 53. The second hole 50B is coupled to a drain line 54. The optical sensor head 7, composed of the end of the light-emitting optical fiber cable 31 and the end of the light-receiving optical fiber cable 32, is located in the first hole 50A, and is located below the through-hole 51.

During the polishing of the substrate W, pure water as a rinsing liquid is supplied into the first hole 50A through the liquid supply line 53, and further supplied into the through-hole 51 through the first hole 50A. The pure water fills a space between the surface (i.e., the surface to be polished) of the substrate W and the optical sensor head 7. The pure water flows into the second hole 50B and is discharged through the drain line 54. The pure water flowing in the first hole 50A and the through-hole 51 prevents the polishing liquid from entering the first hole 50A, thereby securing an optical path.

The light-emitting optical fiber cable 31 is an optical transmission element for transmitting the light, emitted by the light source 44, to the surface of the substrate W. The distal ends of the light-emitting optical fiber cable 31 and the light-receiving optical fiber cable 32 lie in the first hole 50A, and are located near the surface, to be polished, of the substrate W. The optical sensor head 7, composed of the distal end of the light-emitting optical fiber cable 31 and the distal end of the light-receiving optical fiber cable 32, is arranged so as to face the substrate W held by the polishing head 1, so that multiple measurement points of the substrate W are irradiated with the light each time the polishing table 3 makes one revolution. Only one optical sensor head 7 is provided in the polishing table 3 in this embodiment, while a plurality of optical sensor heads 7 may be provided in the polishing table 3.

Figure 5:
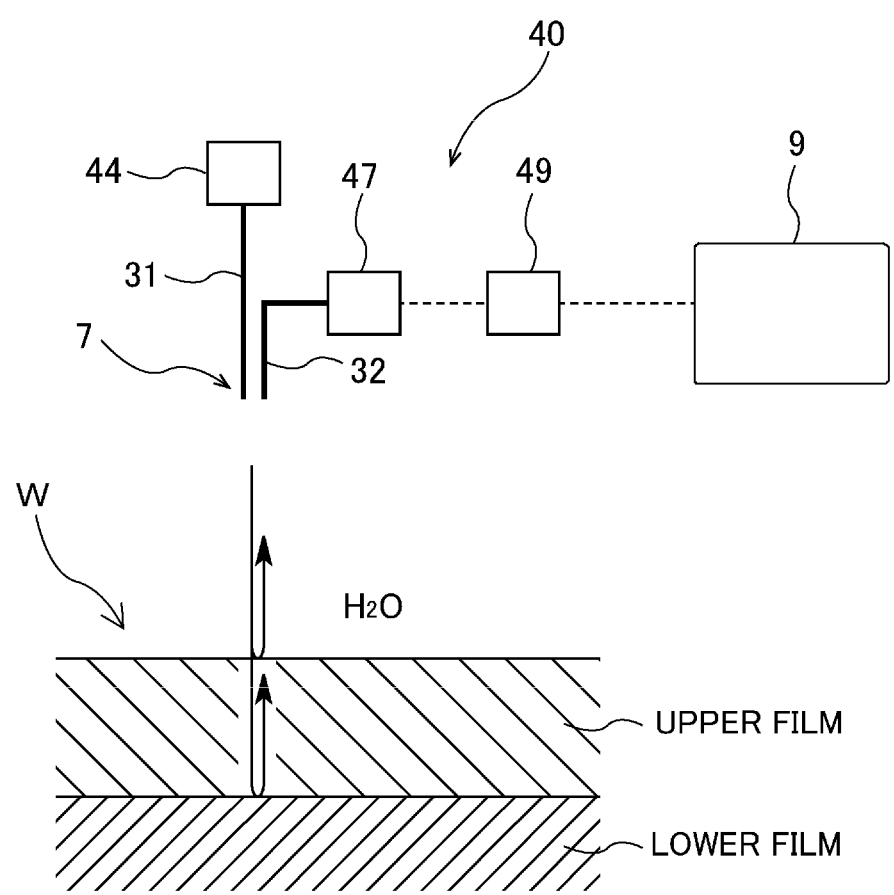
FIG. 5 is a schematic view illustrating a principle of an optical film-thickness measuring device.
Figure 6:
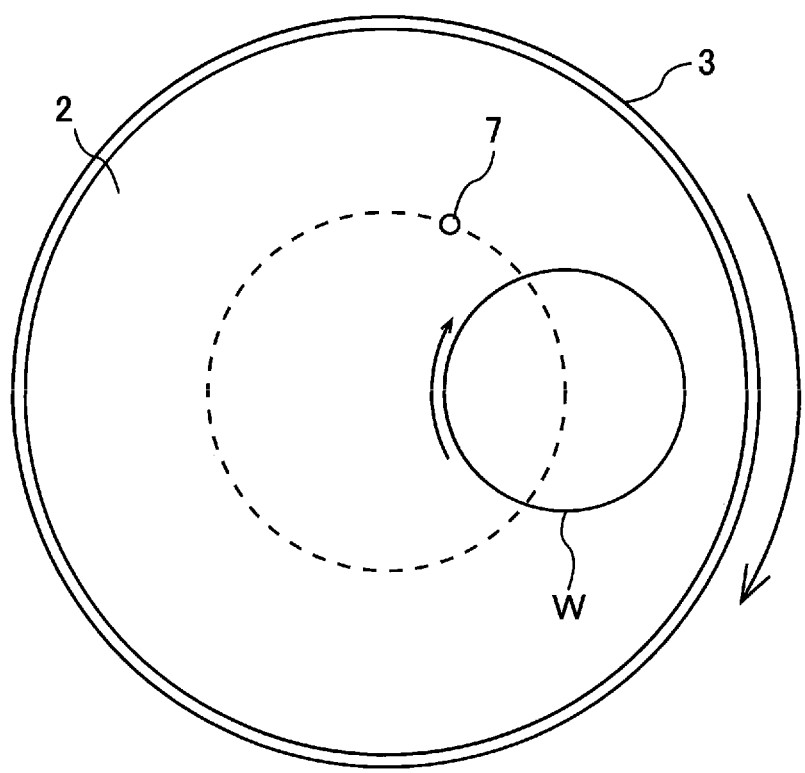
FIG. 6 is a plan view showing a positional relationship between substrate and polishing table.

FIG. 5 is a schematic view illustrating the principle of the optical film-thickness measuring device 40, and FIG. 6 is a plan view showing a positional relationship between the substrate W and the polishing table 3. In this example shown in FIG. 5, the substrate W has a lower film and an upper film formed on the lower film. The upper film is, for example, a silicon layer or a dielectric film. The optical sensor heard 7, which is composed of the distal ends of the light-emitting optical fiber cable 31 and the light-receiving optical fiber cable 32, is oriented toward the surface of the substrate W. The optical sensor heard 7 is arranged so as to direct the light to multiple areas, including the center, of the substrate W each time the polishing table 3 makes one revolution.

The light, which is cast on the substrate W, is reflected off an interface between a medium (e.g., water in the example of FIG. 5) and the upper film and an interface between the upper film and the lower film. Light waves from these interfaces interfere with each other. The manner of interference between the light waves varies according to the thickness of the upper film (i.e., a length of an optical path). As a result, the spectrum, produced from the reflected light from the substrate, varies according to the thickness of the upper film.

During polishing of the substrate W, each time the polishing table 3 makes one revolution, the optical sensor head 7 sweeps across the substrate W. While the optical sensor head 7 is located below the substrate W, the light source 44 emits the light. The light is directed to the surface (i.e., the surface to be polished) of the substrate W and the reflected light from the substrate W is received by the optical sensor head 7 and is transmitted to the spectrometer 47. The spectrometer 47 measures the intensity of the reflected light at each of the wavelengths over the predetermined wavelength range and sends the intensity measurement data of the reflected light to the processing system 49. The processing system 49 produces a spectrum of the reflected light showing the light intensities at the respective wavelengths from the intensity measurement data.

Next, processes of determining the film thickness of the substrate W performed by the processing system 49 will be described. A film thickness at a certain measurement point on the substrate W is determined based on a spectrum of the reflected light from that measurement point. In this embodiment, a plurality of time-series spectra obtained at that measurement point are used to determine a current film thickness at that measurement point on the substrate W. Specifically, each time the polishing table 3 makes one rotation, the optical sensor head 7 directs the light to a predetermined measurement point on the substrate W and receives the reflected light from the predetermined measurement point. The spectrometer 47 decomposes the reflected light according to the wavelength and measures the intensity of the reflected light at each of wavelengths. The intensity measurement data of the reflected light is sent to the processing system 49, and the processing system 49 produces a spectrum from the intensity measurement data of the reflected light.

Directing the light to the substrate W, receiving the reflected light, measuring the intensity of the reflected light, and producing the spectrum are repeated each time the polishing table 3 is rotated. The processing system 49 produces a plurality of spectra from the intensity measurement data of the reflected light returned from the predetermined measurement point when the polishing table 3 is rotated a plurality of times, and arranges the plurality of spectra along the polishing time to generate the three-dimensional data. The plurality of spectra constituting the three-dimensional data include at least the latest spectra. This is because of determining the current film thickness of the substrate W.

Figure 7:
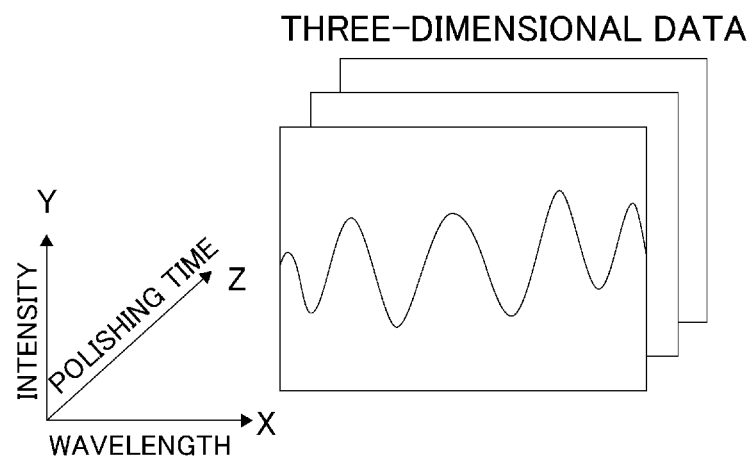
FIG. 7 is a diagram showing an example of three-dimensional data including a plurality of spectra arranged along polishing time.

FIG. 7 is a diagram showing an example of three-dimensional data including a plurality of spectra arranged along the polishing time. This three-dimensional data is data showing a relationship between the polishing time, the wavelength of the reflected light, and the intensity of the reflected light (for example, relative reflectance). X-axis of FIG. 7 is a wavelength axis representing wavelength of the reflected light, Y-axis is an intensity axis representing intensity of the reflected light, and Z-axis is a polishing-time axis representing polishing time. In FIG. 7, the three-dimensional data is expressed by a three-dimensional graph on an XYZ coordinate system.

The three-dimensional data has a structure in which the spectra, as shown in FIG. 2, are arranged along the polishing time. Since the shape of each spectrum changes according to the film thickness of the substrate W, the shapes of the spectra arranged along the polishing time are slightly different. Therefore, the entire three-dimensional data also changes according to the film thickness of the substrate W. The number of spectra constituting the three-dimensional data is not particularly limited, but in one example, the three-dimensional data is composed of five to ten spectra.

The processing system 49 selects one reference data from a plurality of reference data stored in the database 60, and compares the three-dimensional data with the reference data.

Figure 8:
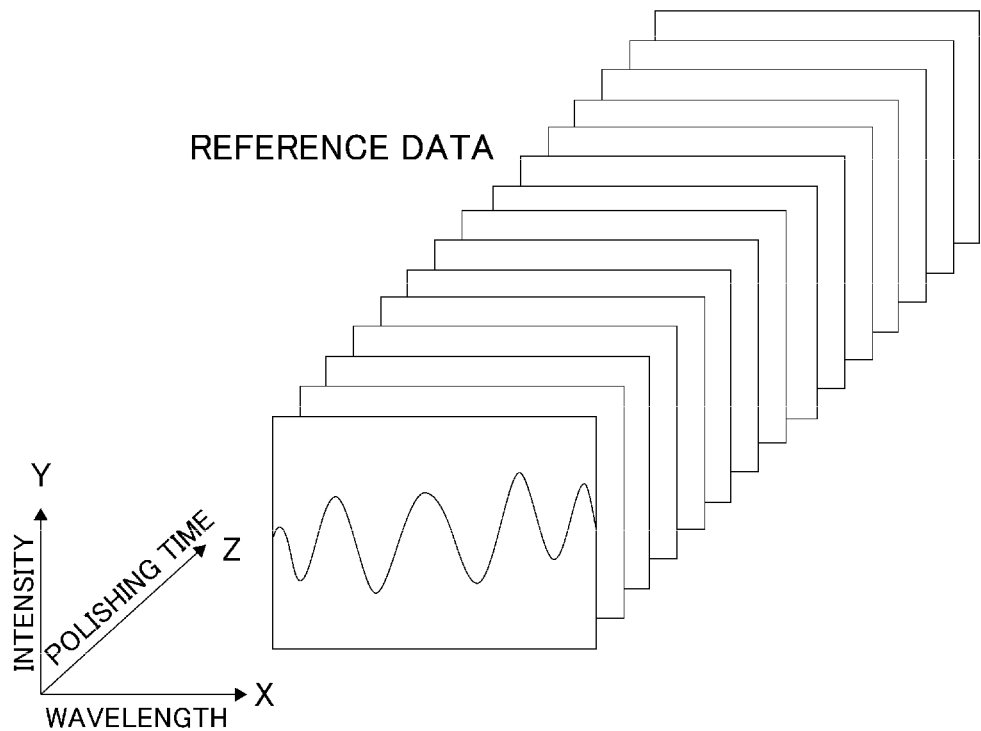
FIG. 8 is a diagram showing an example of reference data.

FIG. 8 is a diagram showing an example of the reference data. Like the three-dimensional data, the reference data is data showing a relationship between the polishing time, the wavelength of the reflected light, and the intensity of the reflected light (for example, relative reflectance). X-axis of FIG. 8 is a wavelength axis representing wavelength of the reflected light, Y-axis is an intensity axis representing intensity of the reflected light, and Z-axis is a polishing-time axis representing polishing time. In FIG. 8, the intensity of the reflected light is represented by an isopleth line. In FIG. 8, the reference data is expressed by a three-dimensional graph on an XYZ coordinate system.

Each reference data is generated by directing the light from the optical sensor head 7 to the predetermined measurement point on the reference substrate while polishing of the reference substrate on the polishing pad is performed, receiving reflected light from the predetermined measurement point on the reference substrate with the optical sensor head 7, measuring intensity of reflected light at each of wavelengths with the spectrometer 47, producing spectra from the intensity measurement data obtained, and arranging the spectra along the polishing time. In the following descriptions, the spectra constituting the reference data are referred to as reference spectra.

The processing system 49 compares the three-dimensional data with the reference data. More specifically, the processing system 49 superimposes the three-dimensional data on the reference data, and calculates a difference between the plurality of spectra included in the three-dimensional data and a plurality of reference spectra included in a data area overlapping the three-dimensional data in the reference data. The above difference is a difference between intensities on the plurality of spectra included in the three-dimensional data and intensities on the plurality of corresponding reference spectra.

Figure 9:
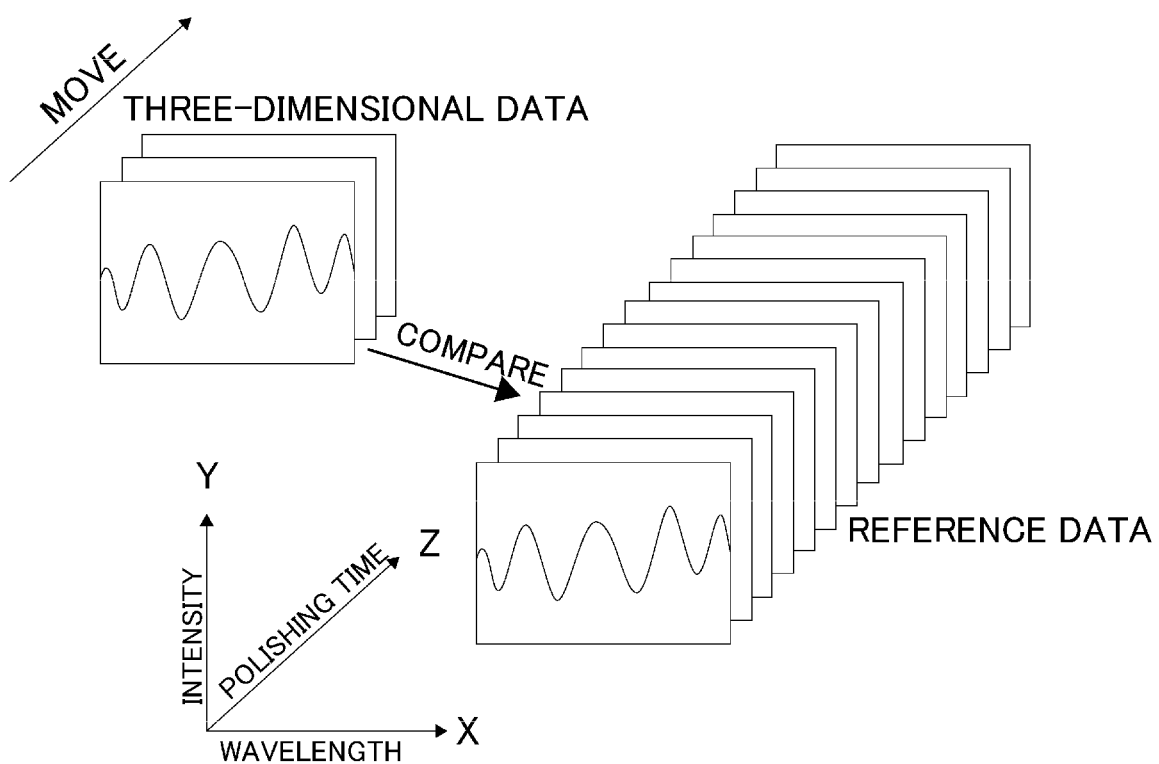
FIG. 9 is a diagram illustrating a process of comparing the three-dimensional data with the reference data.

FIG. 9 is a diagram illustrating a process of comparing the three-dimensional data with the reference data. The processing system 49 calculates the above difference while gradually moving the three-dimensional data along the polishing-time axis of the reference data. The difference is expressed as an absolute value. Specifically, while the processing system 49 moves the three-dimensional data gradually along the polishing-time axis, the processing system 49 calculates an absolute value of the difference between the plurality of spectra included in the three-dimensional data and the plurality of reference spectra included in the data area overlapping the three-dimensional data in the reference data. In the embodiment shown in FIG. 9, the entire three-dimensional data is compared with the reference data, while in one embodiment, a part of the three-dimensional data (for example, a characteristic data area) may be extracted, and the extracted part may be compared with the reference data.

The processing system 49 determines a position of the data area in the reference data that best matches the three-dimensional data. The position of the data area in the reference data that best matches the three-dimensional data is a position that minimizes the above difference. The processing system 49 calculates the above difference while moving the three-dimensional data gradually along the polishing-time axis of the reference data, and determines the position of the three-dimensional data on the reference data corresponding to the smallest difference.

Figure 10:
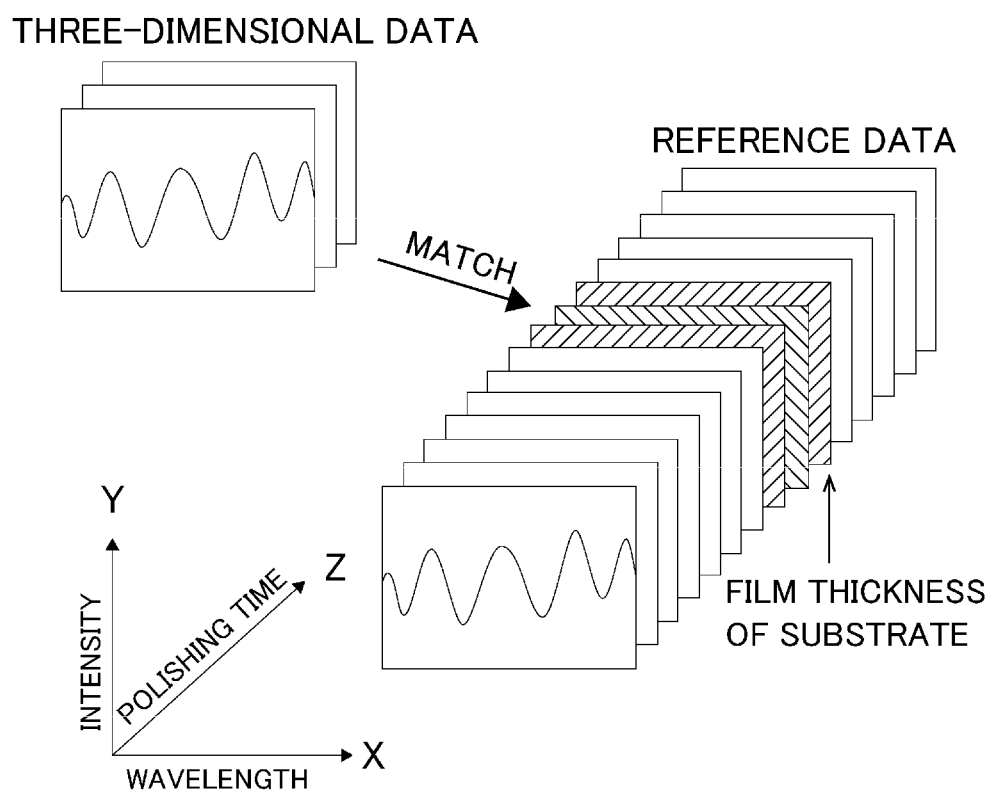
FIG. 10 is a diagram showing a position of a data area in a reference data that best matches the three-dimensional data.

FIG. 10 is a diagram showing the position of the data area in the reference data that best matches the three-dimensional data. The position of the data area in the reference data that best matches the three-dimensional data is a position that minimizes the difference between the plurality of spectra included in the three-dimensional data and the plurality of reference spectra contained in the reference data. The position of the data area in the reference data can be represented by a polishing time on the polishing-time axis of the reference data. The processing system 49 determines the position of the data area that minimizes the difference, and determines a polishing time corresponding to the determined position. More specifically, the processing system 49 determines a latest polishing time among a plurality of polishing times that specify the position of the determined data area.

The processing system 49 determines a film thickness of the substrate W from the determined polishing time. The polishing-time axis of the reference data functions as an axis representing a change in the film thickness of the reference substrate. Specifically, a film thickness of the reference substrate when the polishing time is zero is an initial film thickness of the reference substrate, and a film thickness of the reference substrate when the polishing time is at a polishing end point is a film thickness of the reference substrate after being polished. The initial film thickness of the reference substrate and the film thickness of the reference substrate after being polished are measured by a film-thickness measuring device (not shown). When the reference substrate is polished at a constant polishing rate, a film thickness of the reference substrate at each point in time on the polishing-time axis of the reference data can be calculated from a measured value of the initial film thickness of the reference substrate, a measured value of the film thickness of the reference substrate after being polished, and each point in time on the polishing-time axis. Therefore, a polishing time on the polishing-time axis of the reference data corresponds uniquely to a film thickness of the reference substrate, and each polishing time is associated with a corresponding film thickness. Each film thickness corresponding to each point in time on the polishing-time axis may be calculated in advance. Alternatively, it is also possible to determine a position of the data area that best matches the three-dimensional data, and then calculate a film thickness corresponding to the determined position.

The processing system 49 determines a polishing time corresponding to a position of the data area that minimizes the above-discussed difference, and determines a film thickness associated with the determined polishing time. The determined film thickness is sent to the polishing controller 9. The polishing controller 9 determines a polishing end point of the substrate W based on the determined film thickness, or changes the polishing conditions.

According to the embodiment, the film thickness of the substrate is determined not based on one spectrum but based on the three-dimensional data including time-series spectra. Therefore, even if the three-dimensional data contains a spectrum having a significantly different shape, the influence of such spectrum on the film thickness determination is reduced. As a result, the processing system 49 can accurately determine the film thickness of the substrate W.

Figure 11:
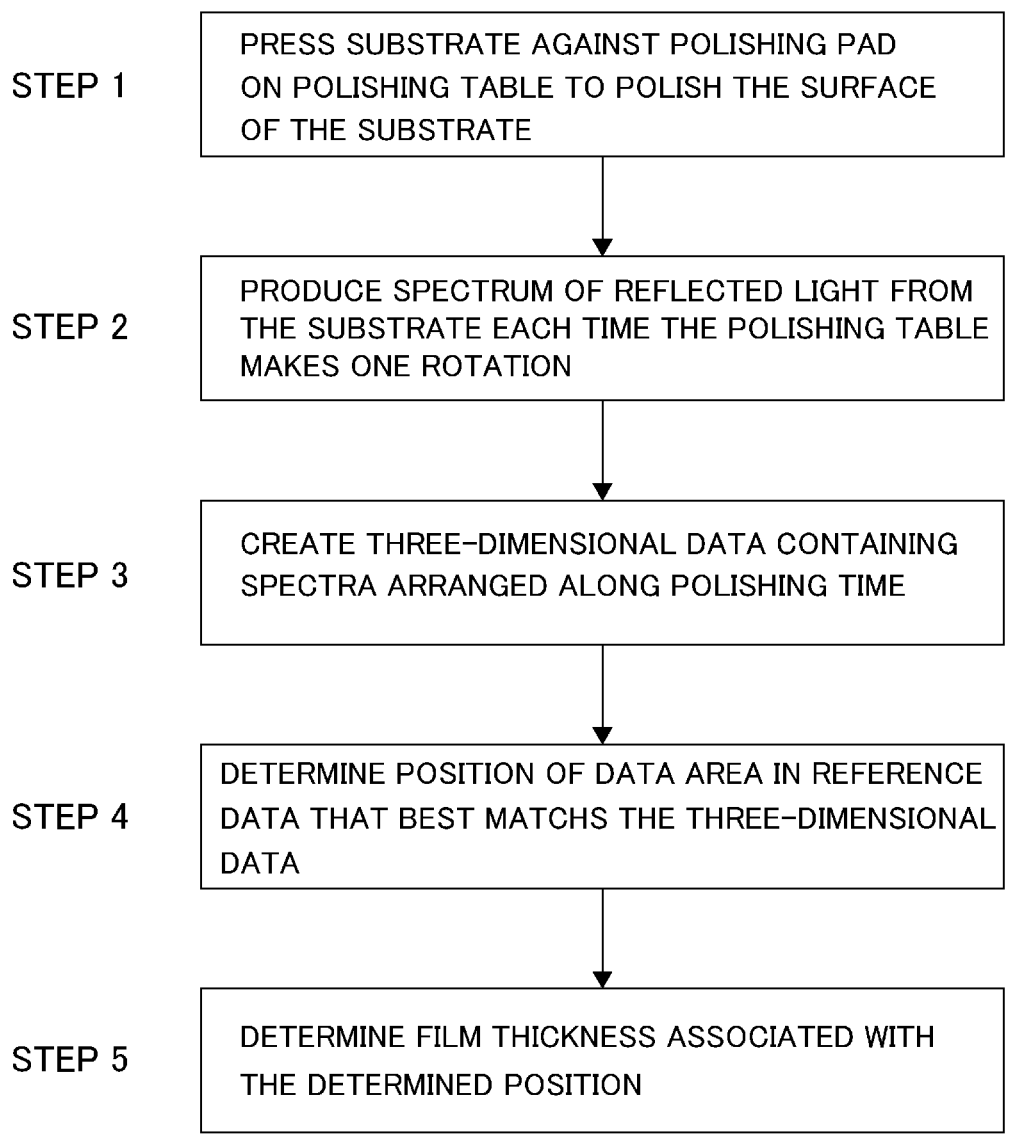
FIG. 11 is a flowchart illustrating a method for determining a film thickness according to the embodiment.

FIG. 11 is a flowchart illustrating a method of determining the film thickness according to the present embodiment.

In step 1, the polishing table 3 and the polishing head 1 are rotated individually, and the substrate W is pressed against the polishing pad 2 on the rotating polishing table 3 so that the surface of the substrate W is polished.

In step 2, each time the polishing table 3 makes one rotation, the processing system 49 receives, from the spectrometer 47, the intensity measurement data of the reflected light from the surface of the substrate W, and produces a spectrum of the reflected light from the intensity measurement data.

In step 3, the processing system 49 creates the three-dimensional data including a plurality of spectra arranged along the polishing time.

In step 4, the processing system 49 compares the three-dimensional data with the reference data and determines the position of the data area in the reference data that best matches the three-dimensional data.

In step 5, the processing system 49 determines a film thickness associated with the determined position.

The processing system 49 constituted by at least one computer operates according to the instructions contained in the program electrically stored in the memory 49a of the processing system 49. Specifically, the processing system 49 performs the step of producing a plurality of spectra from the intensity measurement data of the reflected light from the substrate W during polishing of the substrate W, the step of creating the three-dimensional data by arranging the plurality of spectra along the polishing time, and the step of determining the film thickness of the substrate W based on the three-dimensional data.

The program for causing the processing system 49 to perform these steps is stored in a computer-readable storage medium which is a non-transitory tangible medium, and is provided to the processing system 49 via the storage medium. Alternatively, the program may be input to the processing system 49 via a communication network, such as the Internet or a local area network.

In general, the spectrum varies depending on a thickness of a film that constitutes the exposed surface of the substrate. However, the spectrum can be affected by an underlying structure beneath the film as well. This is because the light emitted from the optical sensor head 7 passes through the film of the substrate and is reflected by the underlying structure. For example, even if the thickness of the film is the same, different underlying structures may cause a change in the way of light reflection and may cause a change in measurement result of the film thickness.

Figure 12:
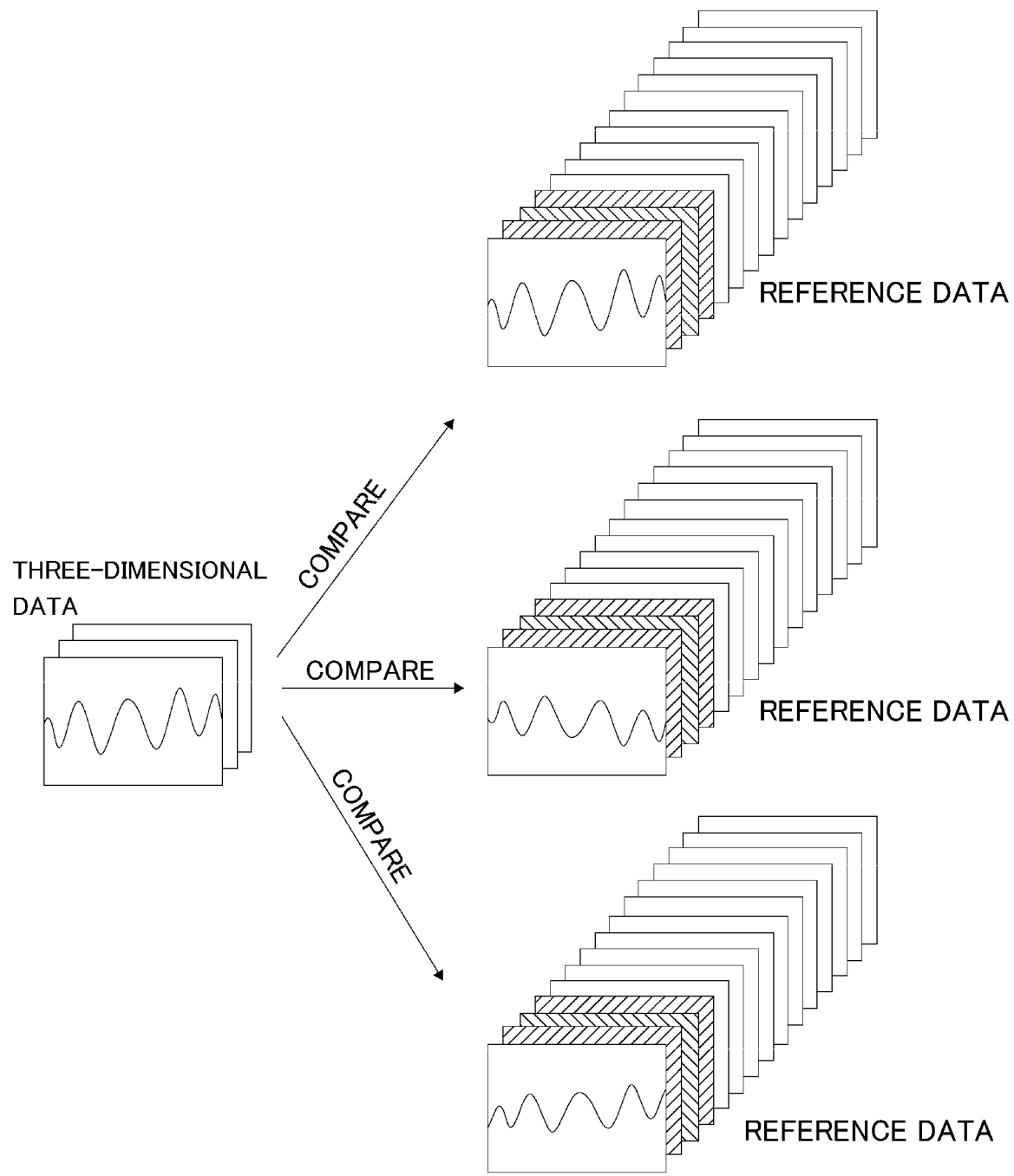
FIG. 12 is a diagram showing a plurality of reference data created by using a plurality of reference substrates having different underlying structures.

In order to prevent such a decrease in accuracy of film thickness measurement due to the difference in the underlying structure, in one embodiment, the processing system 49 may have a plurality of reference data which are created by using a plurality of reference substrates having different underlying structures, as shown in FIG. 12. Each of the plurality of reference data includes a plurality of reference spectra produced during polishing of one of the plurality of reference substrates which have been prepared in advance. These plurality of reference data are stored in the database 60.

As shown in FIG. 12, the processing system 49 selects, from the plurality of reference data, one reference data including a data area that best matches an initial three-dimensional data created at an initial stage of polishing of the substrate. More specifically, the processing system 49 calculates a difference between a plurality of spectra included in the initial three-dimensional data produced at the initial stage of polishing of the substrate and a plurality of reference spectra produced at an initial stage of polishing of a reference substrate. The processing system 49 then selects, from the plurality of reference data, one reference data with the smallest difference. The processing system 49 determines a film thickness of the substrate W using the selected reference data. Specifically, the processing system 49 compares the three-dimensional data created during the polishing of the substrate W with the above-selected reference data, determines a position of a data area in the selected reference data that best matches the three-dimensional data, and determines a film thickness associated with this determined position.

According to the present embodiment, the plurality of reference data created by using the plurality of reference substrates having different underlying structures are prepared, and one reference data including a data area best matching the initial three-dimensional data is selected from the plurality of reference data. A reference substrate that has been used to create this selected reference data is presumed to have an underlying structure that is similar to the underlying structure of the substrate being polished. Therefore, with use of the reference data generated using such a reference substrate, the processing system 49 can determine the accurate film thickness of the substrate.

Next, another embodiment of a method of determining the film thickness of the substrate will be described. The same element as the element in the above-described embodiments is given the same name, and the duplicate descriptions thereof will be omitted. Furthermore, configurations and operations of the present embodiment, which will not be particularly described, are the same as those of the above-described embodiments, and the duplicated descriptions will be omitted.

Figure 13:
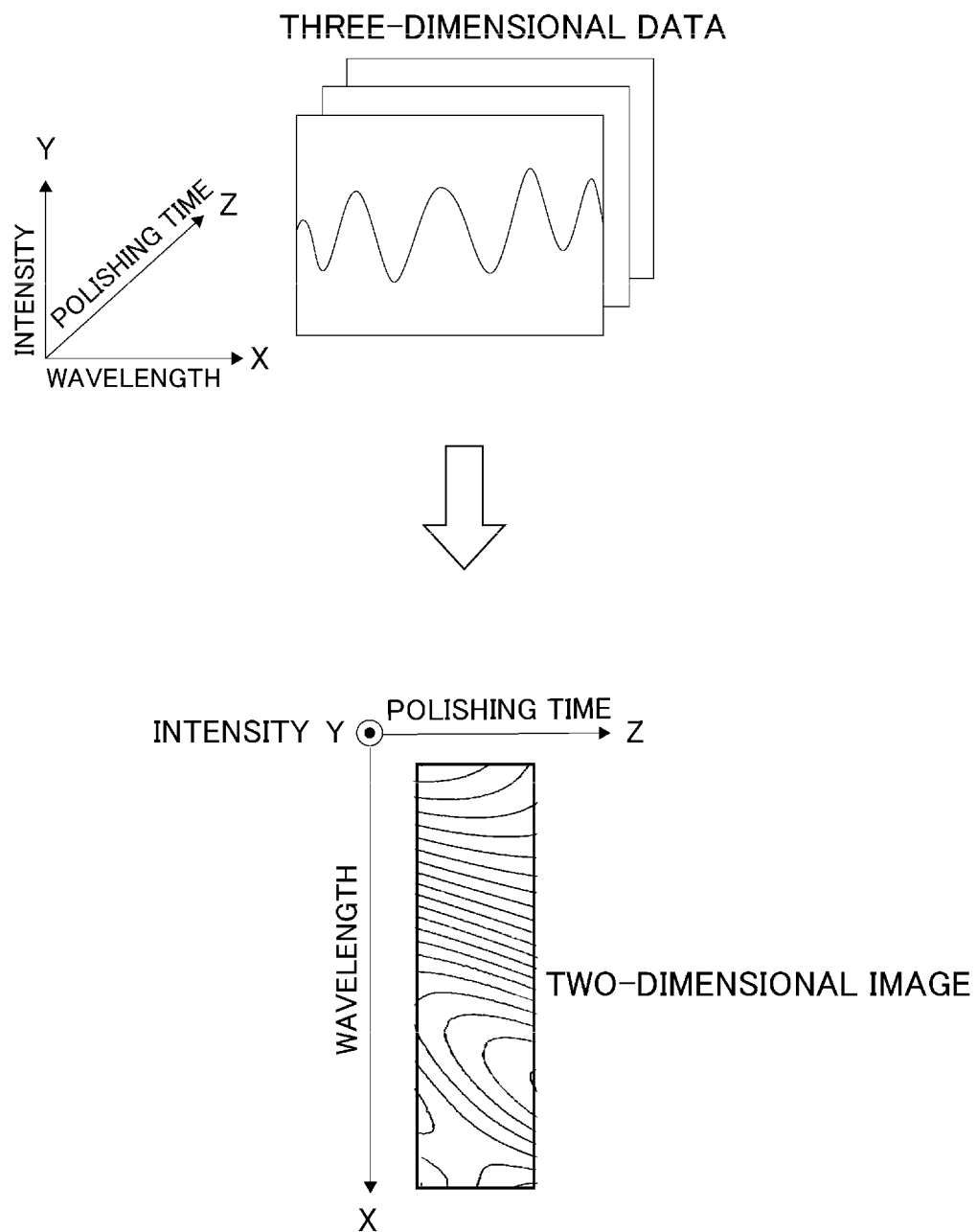
FIG. 13 is a diagram showing a process of converting the three-dimensional data into a two-dimensional image.
Figure 14:
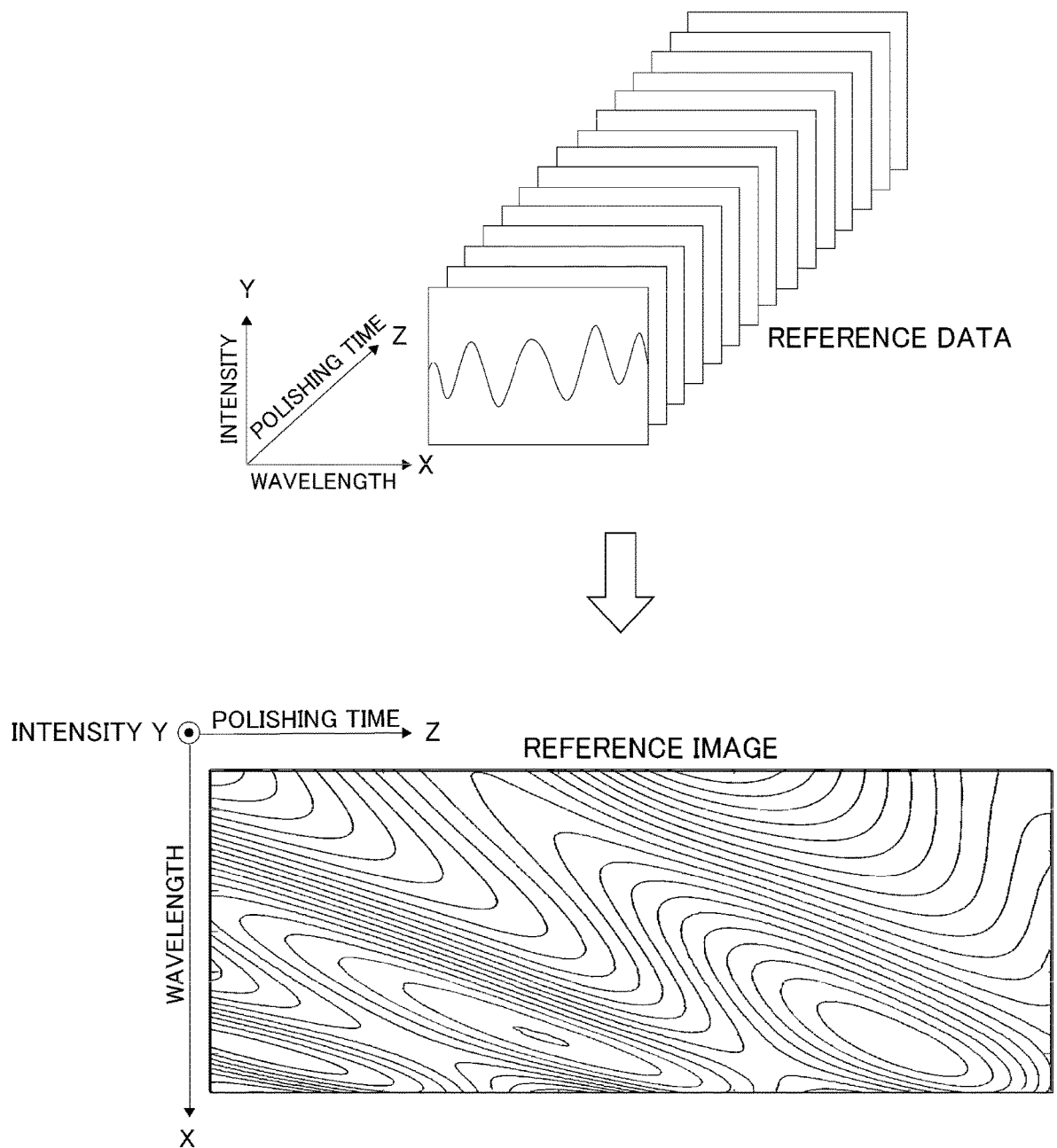
FIG. 14 is a diagram showing a process of converting the reference data into a reference image.

The basic concept of the method of determining the film thickness according to the present embodiment is the same as that in the above-described embodiments, but the present embodiment is different from the above embodiments in that the three-dimensional data and the reference data are converted into a two-dimensional image and a reference image, respectively. FIG. 13 is a diagram showing a process of converting the three-dimensional data into a two-dimensional image, and FIG. 14 is a diagram showing a process of converting the reference data into a reference image.

The processing system 49 is configured to convert the three-dimensional data and the reference data into a two-dimensional image and a reference image, respectively. More specifically, as shown in FIGS. 13 and 14, the processing system 49 color-codes the intensities of the reflected light contained in the three-dimensional data and the reference data to generate a colored two-dimensional image and a colored reference image. The two-dimensional image and the reference image may be color images or grayscale images. In FIG. 13, the color-coded intensities are represented by isopleth lines.

In one embodiment, the processing system 49 may perform filtering, such as smoothing, i.e., noise reduction process, on the two-dimensional image and the reference image. For example, a color index value (for example, a grayscale value) of each pixel constituting the two-dimensional image may be replaced with an average of color index values of a plurality of pixels around that pixel. Alternatively, the color index values of the plurality of surrounding pixels may be multiplied by weight coefficient(s), and an average of resultant values may be used as the color index value of each pixel. Such noise reduction process (or filtering) can reduce local noise, such as spike noise.

Figure 15:
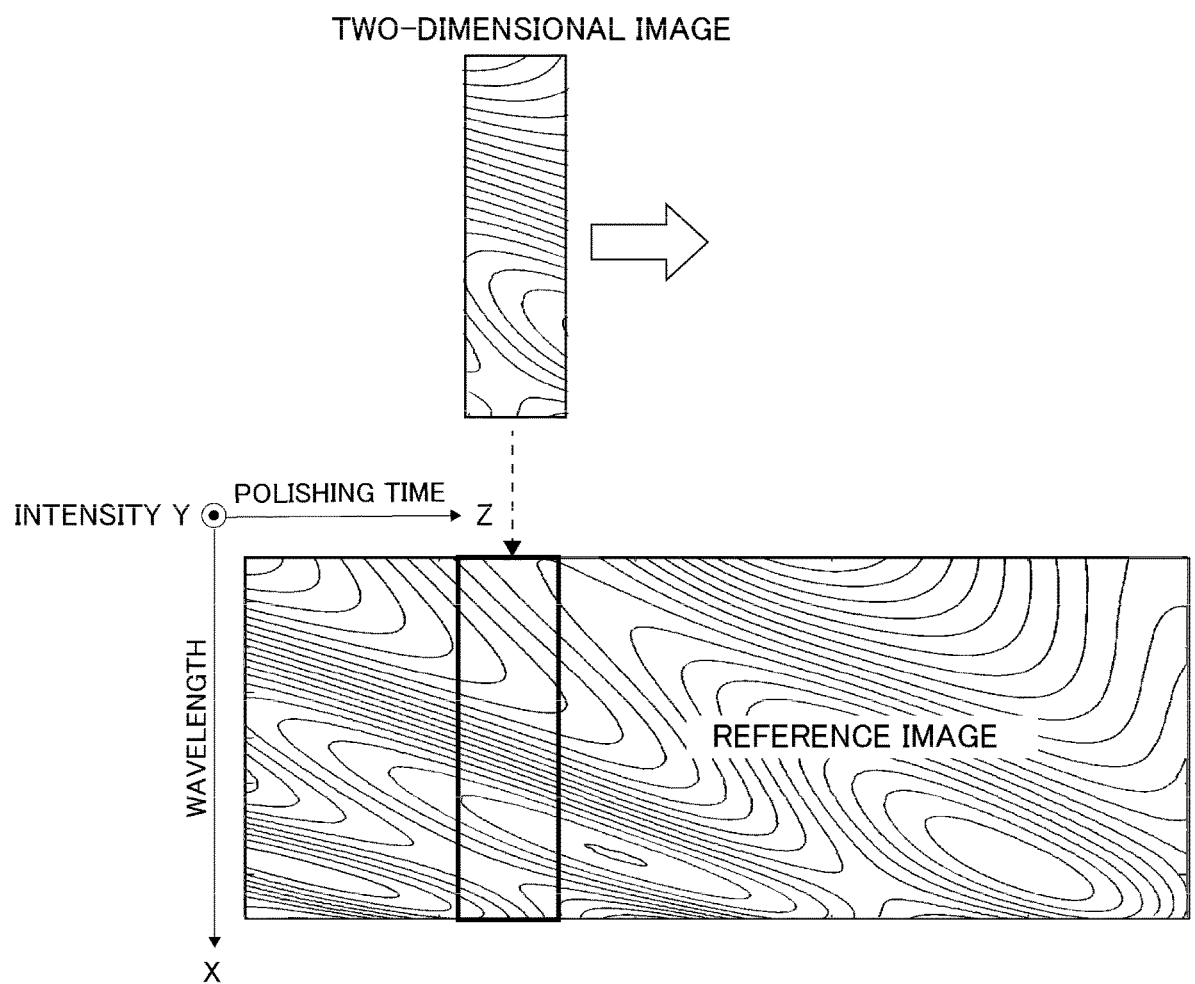
FIG. 15 is a diagram illustrating a process of comparing the two-dimensional image with the reference image.

The processing system 49 determines a position of an image area in the reference image that best matches the two-dimensional image. More specifically, as shown in FIG. 15, the processing system 49 superimposes the two-dimensional image on the reference image and gradually moves the two-dimensional image along a polishing-time axis of the reference image to determine a position of the image area in the reference image that best matches the two-dimensional image. More specifically, the processing system 49 calculates a difference between the two-dimensional image and the reference image while gradually moving the two-dimensional image, and determines the position where the difference is the smallest. The position with the smallest difference is a position of the image area in the reference image that best matches the two-dimensional image. A known image processing technique can be used as a method of determining an image area in the reference image that best matches the two-dimensional image. For example, a pattern matching technique or a template matching technique (e.g., a normalized cross-correlation method) can be used. In the embodiment shown in FIG. 15, the entire two-dimensional image is compared with the reference image, while in one embodiment, a part of the two-dimensional image (for example, a characteristic image area) may be extracted, and the extracted part may be compared with the reference image.

Figure 16:
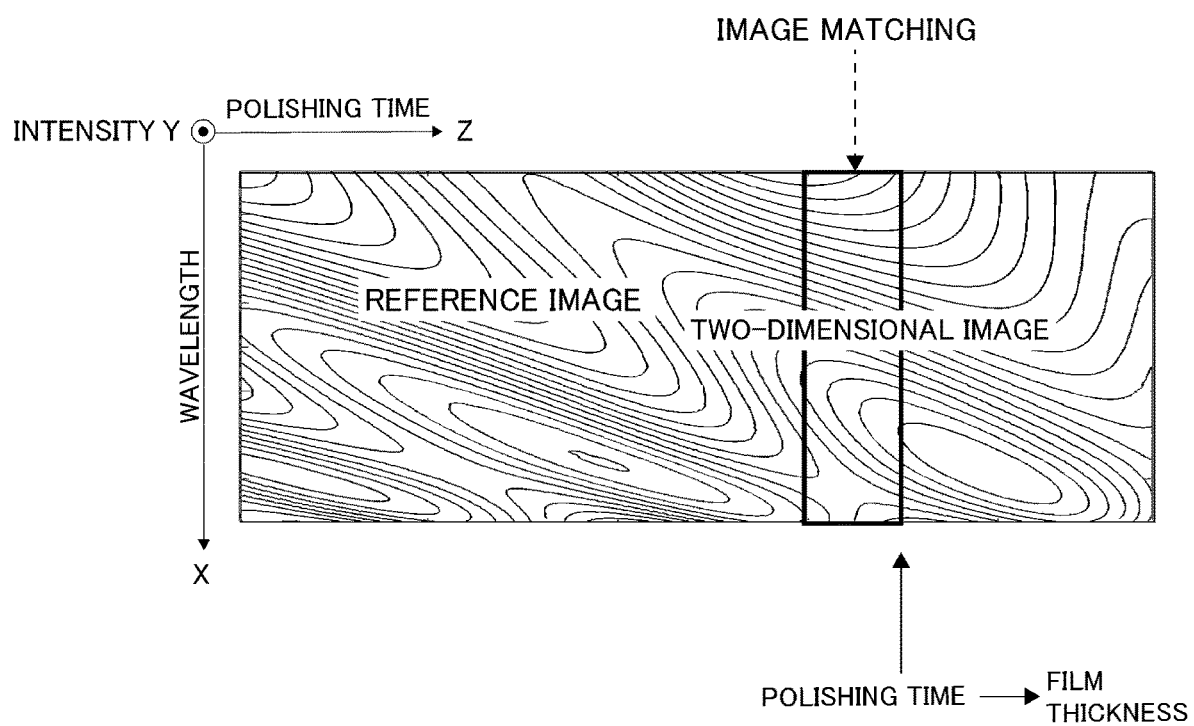
FIG. 16 is a diagram showing a position of an image area in the reference image that best matches the two-dimensional image.

As shown in FIG. 16, the processing system 49 determines a polishing time corresponding to the position of the image area in the reference image that best matches the two-dimensional image. More specifically, the processing system 49 determines a latest polishing time among a plurality of polishing times that identify the position of the image area in the reference image that best matches the two-dimensional image. In addition, the processing system 49 determines a film thickness associated with the determined polishing time. The determined film thickness is the current film thickness of the substrate W and is sent to the polishing controller 9. The polishing controller 9 determines a polishing end point of the substrate based on the determined film thickness, or changes polishing conditions for the substrate. Further, the processing system 49 may calculate a predicted polishing time to the polishing end point from a difference between the current film thickness and a target film thickness.

Figure 17:
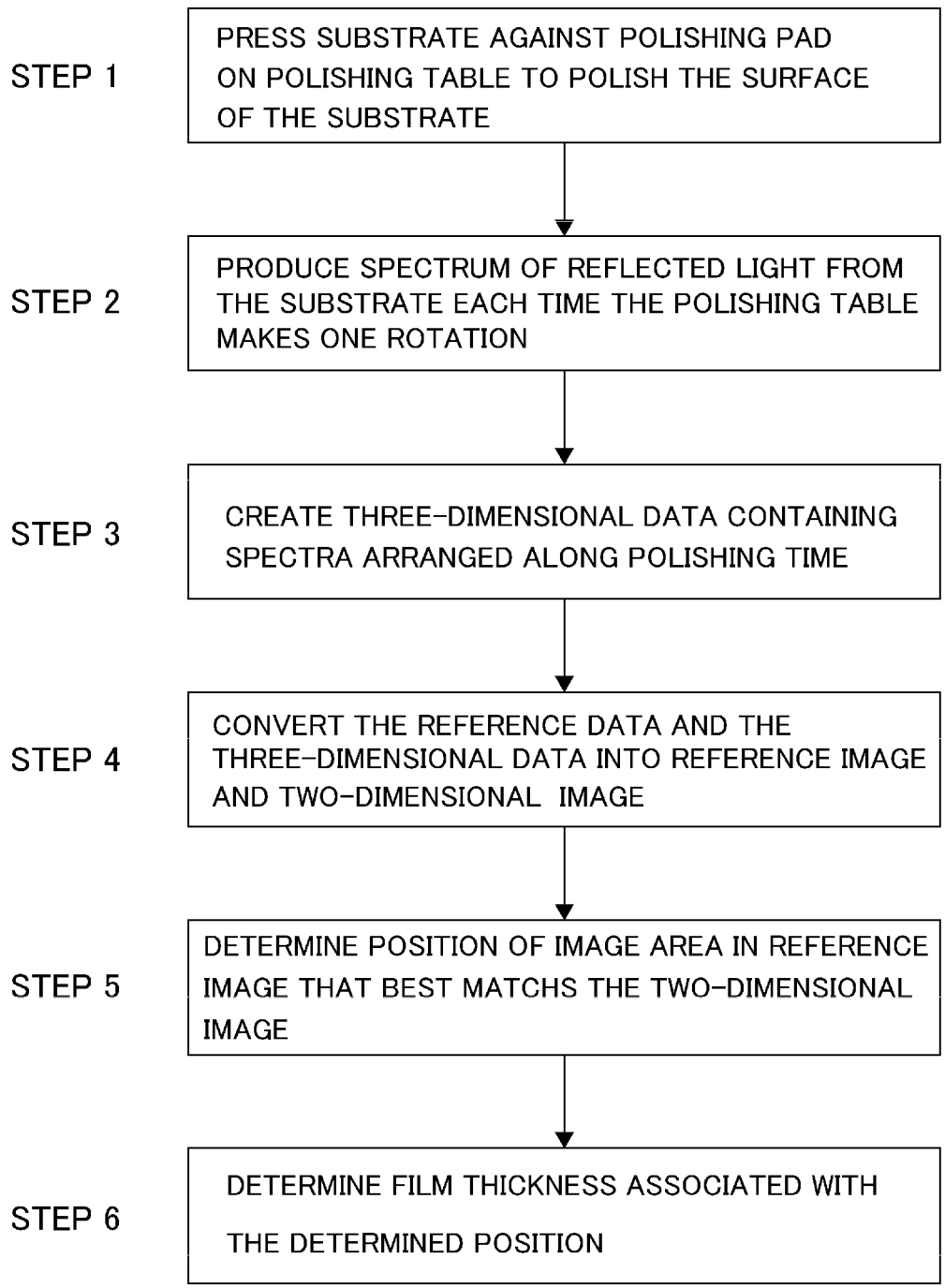
FIG. 17 is a flowchart illustrating a method for determining the film thickness according to the embodiment.

FIG. 17 is a flowchart illustrating the method of determining a film thickness according to the present embodiment.

In step 1, the polishing table 3 and the polishing head 1 are rotated individually, and the substrate W is pressed against the polishing pad 2 on the rotating polishing table 3 so that the surface of the substrate W is polished.

In step 2, each time the polishing table 3 makes one rotation, the processing system 49 receives, from the spectrometer 47, the intensity measurement data of the reflected light from the surface of the substrate W, and produces a spectrum of the reflected light from the intensity measurement data.

In step 3, the processing system 49 creates the three-dimensional data including a plurality of spectra arranged along the polishing time.

In step 4, the processing system 49 converts the reference data and the three-dimensional data into the reference image and the two-dimensional image, respectively.

In step 5, the processing system 49 determines a position of the image area in the reference image that best matches the two-dimensional image.

In step 6, the processing system 49 determines a film thickness associated with the determined position.

The embodiment described with reference to FIG. 12 can also be applied to the present embodiment described with reference to FIGS. 13 to 17. Specifically, the processing system 49 converts a plurality of reference data, including a plurality of reference spectra produced during polishing of a plurality of reference substrates prepared in advance, into a plurality of reference images, converts an initial three-dimensional data created in an initial stage of polishing of the substrate W into an initial two-dimensional image, and selects, from the plurality of reference images, one reference image including an image area that best matches the initial two-dimensional image. The plurality of reference substrates have different underlying structures. The processing system 49 uses the selected reference image to determine the film thickness of the substrate W. Specifically, the processing system 49 compares the two-dimensional image generated during polishing of the substrate W with the selected reference image, determines a position of the image area in the reference image that best matches the two-dimensional image, and determines the film thickness associated with the determined position.

Next, still another embodiment of a method of determining the film thickness of the substrate will be described. The same element as the element in the above-described embodiments is given the same name, and the duplicate descriptions thereof will be omitted. Furthermore, configurations and operations of the present embodiment, which will not be particularly described, are the same as those of the above-described embodiments, and the duplicated descriptions will be omitted.

The processing system 49 includes a film-thickness calculation model stored in the memory 49a. The processing system 49 is configured to input three-dimensional data into the film-thickness calculation model that has been constructed according to an artificial intelligence algorithm and output a film thickness from the film-thickness calculation model.

Examples of artificial intelligence algorithms include support vector regression method, deep learning method, random forest method, decision tree method, etc. In this embodiment, the deep learning method, which is an example of machine learning, is used. The deep learning method is a learning method based on a neural network having multiple intermediate layers (also called hidden layers). In this specification, machine learning using a neural network having an input layer, two or more intermediate layers, and an output layer is referred to as deep learning.

Figure 18:
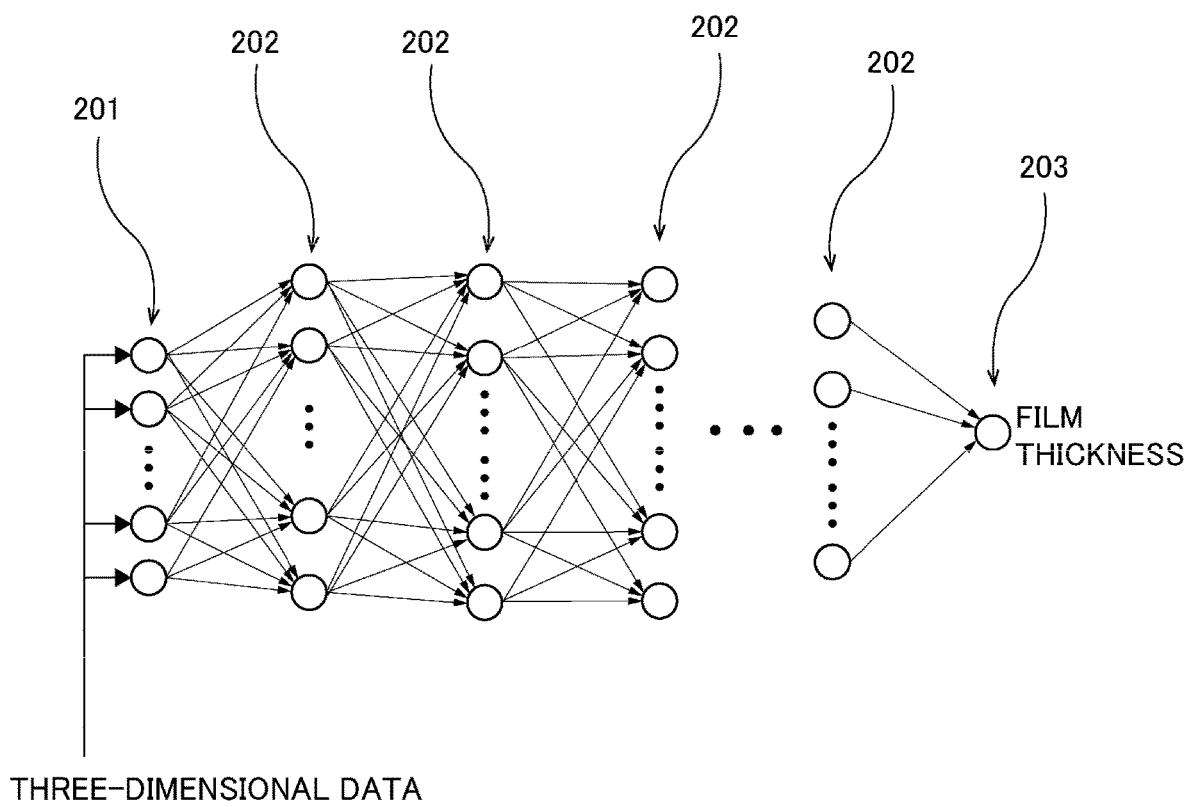
FIG. 18 is a schematic diagram showing an example of a film-thickness calculation model.

FIG. 18 is a schematic view showing an example of the film-thickness calculation model. The film-thickness calculation model is a neural network having an input layer 201, a plurality of intermediate layers 202, and an output layer 203.

The intensities of the reflected light included in the three-dimensional data are input to the input layer 201 of the film-thickness calculation model. More specifically, the intensities of the reflected light, represented by each spectrum constituting the three-dimensional data, are input to the input layer 201. The processing system 49 perform arithmetic operations according to an algorithm defined by the neural network, and the output layer 203 of the film-thickness calculation model outputs a numerical value representing a film thickness of the substrate. It is noted that the configuration of the film-thickness calculation model shown in FIG. 18 is an example, and the present invention is not limited to the example shown in FIG. 18.

The film-thickness calculation model is composed of a neural network. The memory 49a of the processing system 49 stores a program for constructing the film-thickness calculation model according to the machine learning algorithm. The processor 49b of the processing system 49 constructs the film-thickness calculation model by performing arithmetic operations according to the instruction included in the program. Constructing the film-thickness calculation model according to the machine learning algorithm includes optimizing parameters of the neural network, such as weights.

The film-thickness calculation model is constructed or produced using a training data set containing a combination of a plurality of training three-dimensional data and a plurality of film thicknesses associated with the plurality of training three-dimensional data, respectively. More specifically, in the construction of the film-thickness calculation model, the plurality of training three-dimensional data included in the training data set are used as explanatory variables, and the plurality of film thicknesses included in the training data set are used as objective variables (or correct answer data). Specifically, the processing system 49 inputs the training three-dimensional data to the input layer of the film-thickness calculation model, and adjusts the parameters (weight, bias, etc.) of the film-thickness calculation model such that the output layer of the film-thickness calculation model outputs a film thickness (a correct answer data) corresponding to the training three-dimensional data that has been input. As a result of such machine learning, the film-thickness calculation model as a trained model is created. The film-thickness calculation model is stored in the memory 49a of the processing system 49.

Figure 19:
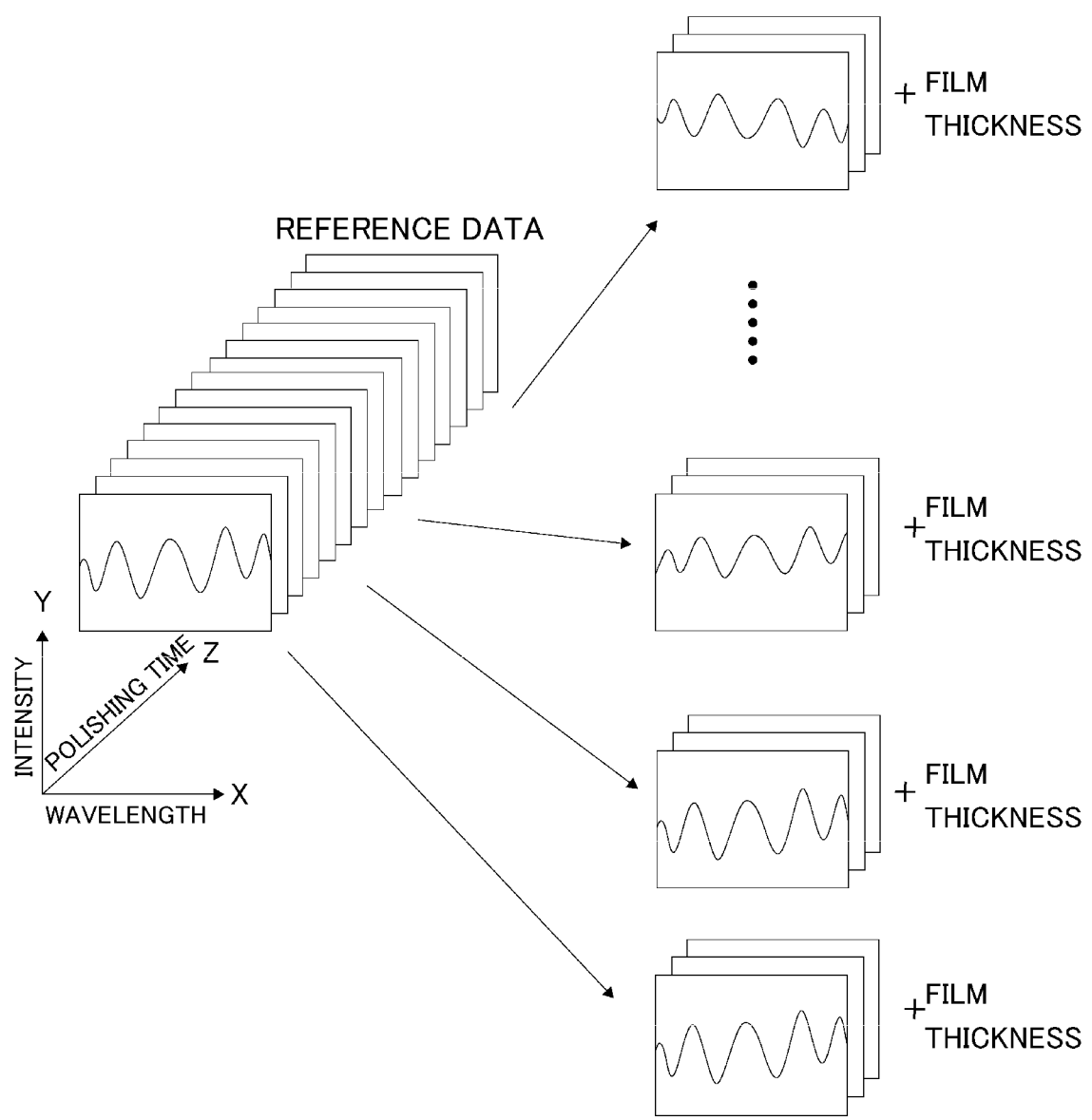
FIG. 19 is a diagram illustrating an example of producing a training data set from the reference data.

The training data set can be created from the reference data. FIG. 19 is a diagram illustrating an example of producing the training data set from the reference data. As discussed previously, the reference data is created by directing the light from the optical sensor head 7 to the reference substrate while the reference substrate is being polished on the polishing pad, receiving the reflected light from the reference substrate with the optical sensor head 7, measuring the intensity of the reflect light at each of the wavelengths with the spectrometer 47, generating a reference spectrum from the intensity measurement data obtained, and arranging the generated reference spectra along the polishing time.

The processing system 49 reads out the reference data from the database 60, divides the reference data along the polishing-time axis as shown in FIG. 19, and creates a plurality of training three-dimensional data. A time width of each training three-dimensional data is the same as a time width of the three-dimensional data created during polishing of the substrate W. Each training three-dimensional data is associated with a corresponding film thickness. A film thickness of the reference substrate when the polishing time is zero is an initial film thickness of the reference substrate, and a film thickness of the reference substrate when the polishing time is at the polishing end point is a film thickness of the reference substrate after being polished. The initial film thickness of the reference substrate and the film thickness of the reference substrate after being polished are measured by a film-thickness measuring device (not shown). When the reference substrate is polished at a constant polishing rate, a film thickness of the reference substrate at each point in time on the polishing-time axis of the reference data can be calculated from a measured value of the initial film thickness of the reference substrate, and a measured value of the film thickness of the reference substrate after being polished, and each point in time on the polishing-time axis. Therefore, the training three-dimensional data divided along the polishing-time axis uniquely correspond to the film thicknesses. The processing system 49 associates each training three-dimensional data with a corresponding film thickness by allocating the corresponding film thickness to the training three-dimensional data.

In order to improve the accuracy of the film-thickness calculation model, it is preferable to prepare a large amount of training three-dimensional data. Therefore, a plurality of reference substrates are prepared, and a plurality of reference data are created from polishing of these reference substrates, so that a plurality of training three-dimensional data are produced from each reference data according to the example shown in FIG. 19. Each training three-dimensional data is associated (or connected) with a corresponding film thickness. The corresponding film thickness is the correct answer data with respect to each training three-dimensional data. The training data set including the combination of the training three-dimensional data and the corresponding film thicknesses produced in this manner is stored in the database 60.

The processing system 49 constructs the film-thickness calculation model according to the machine learning algorithm using the training data set including the training three-dimensional data and the film thicknesses (i.e., the correct answer data). The parameters of the film-thickness calculation model may include bias in addition to weight. The film-thickness calculation model constructed in this way is stored in the memory 49a.

During the polishing of the substrate W, the processing system 49 produces a spectrum from the intensity measurement data sent from the spectrometer 47 each time the polishing table 3 makes one rotation, arranges a plurality of spectra along the polishing time to create a three-dimensional data, inputs this three-dimensional data to the film-thickness calculation model, and outputs a film thickness of the substrate W from the film-thickness calculation model.

According to the present embodiment, as with the embodiments described so far, the film thickness of the substrate W is determined not based on one spectrum but based on the three-dimensional data including time-series spectra. Therefore, even if the three-dimensional data contains a spectrum having a significantly different shape, the influence of such spectrum on determining of the film thickness is reduced. As a result, the processing system 49 can accurately determine the film thickness of the substrate W.

The processing system 49 is composed of at least one computer. The at least one computer may be one server or a plurality of servers. The processing system 49 may be an edge server coupled to the spectrometer 47 by a communication line, or may be a cloud server coupled to the spectrometer 47 by a communication network, such as the Internet or a local area network. Alternatively, the processing system 49 may be a gateway, a fog server, a router, or the like coupled to the spectrometer 47. The processing system 49 may be a plurality of servers coupled by a communication network, such as the Internet or a local area network. For example, the processing system 49 may be a combination of an edge server and a cloud server.

The film-thickness calculation model of this embodiment is composed of a neural network. The memory 49a of the processing system 49 stores a program for constructing the film-thickness calculation model according to the machine learning algorithm. The processor 49b of the processing system 49 constructs the film-thickness calculation model by performing arithmetic operations according to the instruction included in the program. Constructing the film-thickness calculation model according to the machine learning algorithm includes optimizing parameters of the neural network, such as weights.

Figure 20:
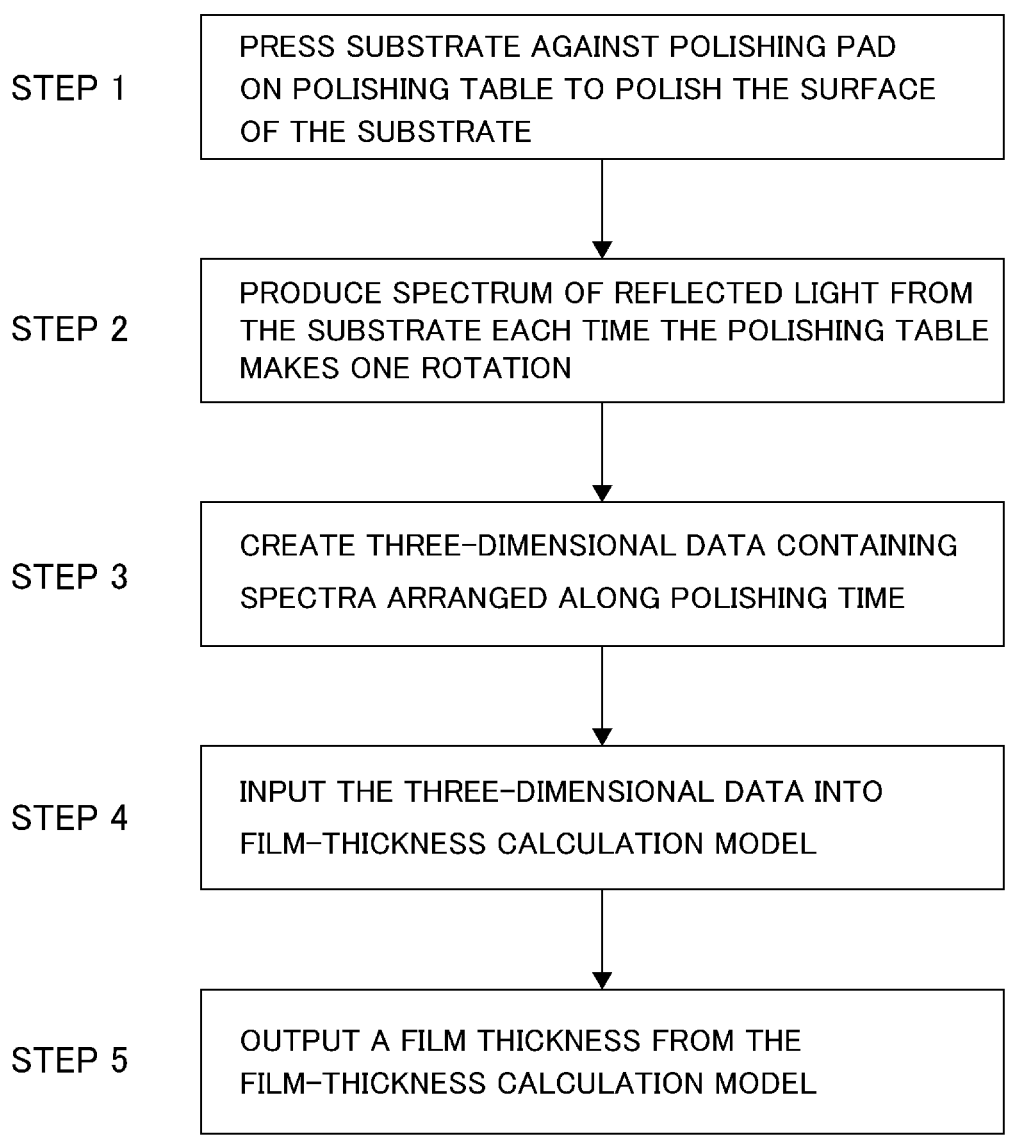
FIG. 20 is a flowchart illustrating a method for determining the film thickness according to the embodiment.

FIG. 20 is a flowchart illustrating a method for determining the film thickness of the present embodiment.

In step 1, the polishing table 3 and the polishing head 1 are rotated individually, and the substrate W is pressed against the polishing pad 2 on the rotating polishing table 3 so that the surface of the substrate W is polished.

In step 2, each time the polishing table 3 makes one rotation, the processing system 49 receives, from the spectrometer 47, the intensity measurement data of the reflected light from the surface of the substrate W, and produces a spectrum of the reflected light from the intensity measurement data.

In step 3, the processing system 49 creates the three-dimensional data including a plurality of spectra arranged along the polishing time.

In step 4, the processing system 49 inputs the three-dimensional data into the film-thickness calculation model that has been constructed according to the algorithm of artificial intelligence.

In step 5, the processing system 49 outputs the film thickness of the substrate W from the film-thickness calculation model.

In one embodiment, the processing system 49 may generate reference data from the spectrum of reflected light produced during polishing of the substrate W. Specifically, the processing system 49 produces spectra of the reflected light during polishing of the substrate W, and arranges these spectra along the polishing time to generate reference data as shown in FIG. 19. The processing system 49 further divides the reference data along the polishing-time axis to create a plurality of training three-dimensional data. An initial film thickness of the substrate W and a film thickness of the substrate W after polishing of the substrate W are measured by a film-thickness measuring device (not shown). The processing system 49 associates each training three-dimensional data with a corresponding film thickness by allocating the corresponding film thickness to the training three-dimensional data. In this way, the processing system 49 generates the reference data and further generates a set of the training three-dimensional data and the corresponding film thicknesses each time the substrate is polished. Further, the processing system 49 updates the training data set by adding the newly generated set of the training three-dimensional data and the corresponding film thicknesses to the training data set. The processing system 49 may reconstruct the film-thickness calculation model by using the training data set updated periodically and may update the film-thickness calculation model.

The accuracy of the film thickness calculation of the film-thickness calculation model may depend on the training data set. Therefore, in order to improve the accuracy of the film thickness calculation of the film-thickness calculation model, preprocessing of the training data set may be performed as follows. A plurality of reference substrates are polished by the polishing apparatus shown in FIG. 1. The processing system 49 produces a plurality of reference spectra while polishing of the plurality of reference substrates is performed, and creates a plurality of training three-dimensional data including these reference spectra. Creating of the training three-dimensional data is carried out according to the method described with reference to FIG. 19.

Figure 21:
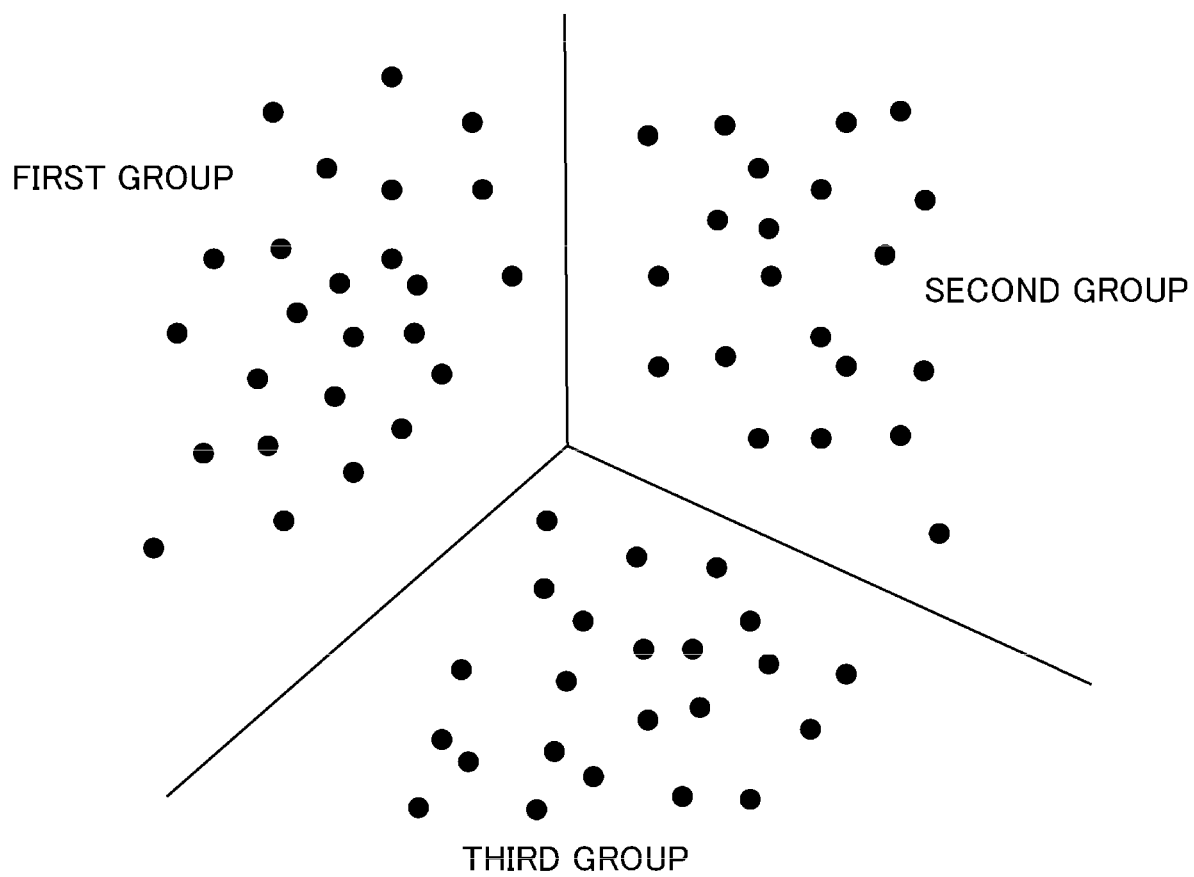
FIG. 21 is a diagram illustrating a process of dividing a plurality of training three-dimensional data into a plurality of groups according to a clustering algorithm.
Figure 22:
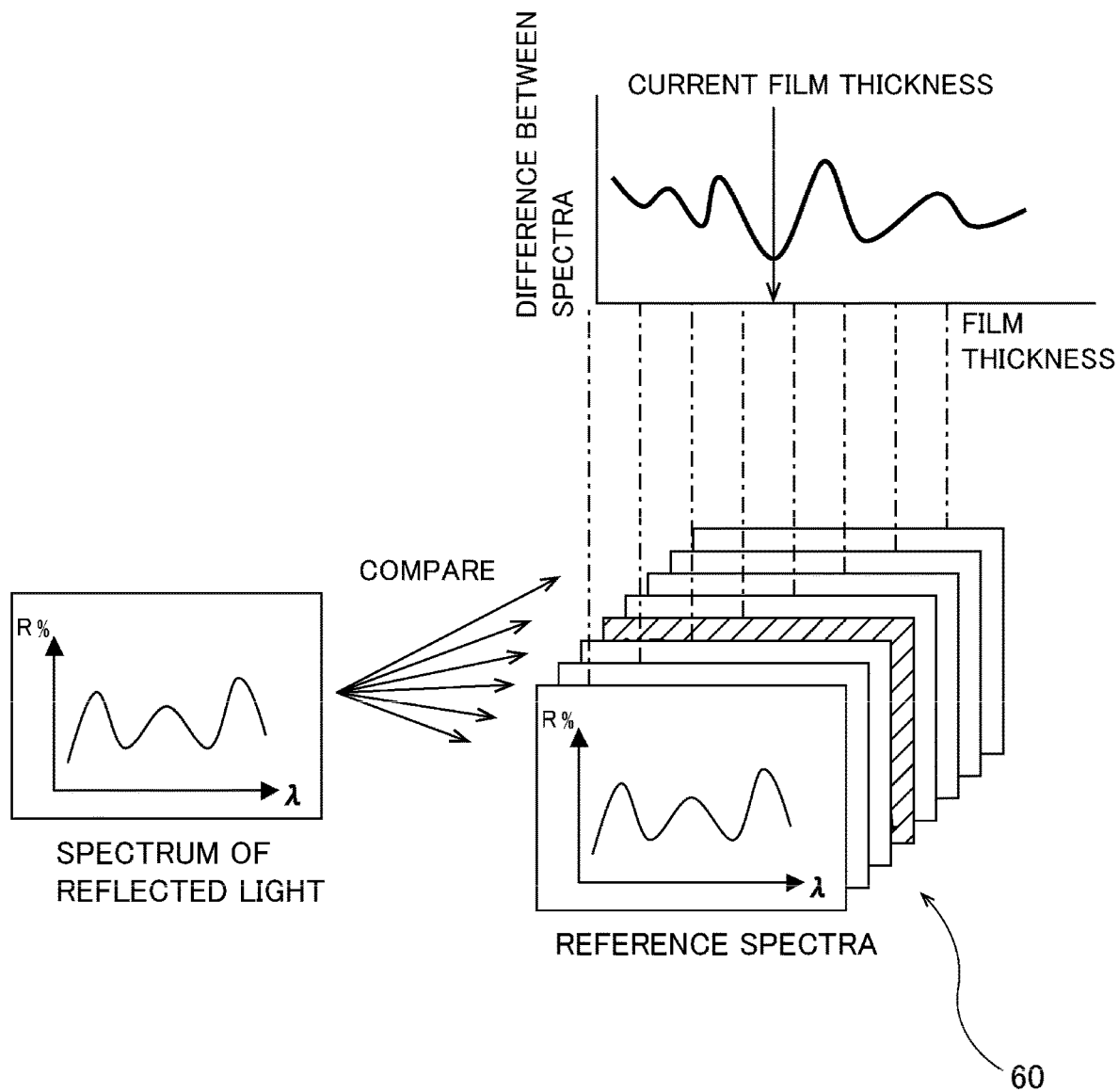
FIG. 22 is a diagram illustrating an example of a conventional method of determining a film thickness from a spectrum of reflected light.

As shown in FIG. 21, the processing system 49 divides the plurality of created training three-dimensional data into a plurality of groups according to a clustering algorithm. In FIG. 21, black circles represent training three-dimensional data. Clustering is called cluster analysis, and the clustering algorithm is a type of artificial intelligence algorithm that classifies multiple training three-dimensional data based on a certain feature. The memory 49a of the processing system 49 stores therein a program for dividing the plurality of training three-dimensional data into a plurality of groups according to the clustering algorithm. The processor 49b of the processing system 49 divides the plurality of training three-dimensional data into a plurality of groups by performing arithmetic operations according to an instruction included in the program. In the example shown in FIG. 21, the plurality of training three-dimensional data are divided into three groups, but may be divided into two groups or four or more groups.

Next, a test substrate is polished by the polishing apparatus shown in FIG. 1. The test substrate is a substrate having the same exposed film and the same underlying structure as those of the substrate W to be polished. The exposed film is a film constituting an exposed surface of a substrate, and the underlying structure is a structure lying beneath the exposed film. In general, the exposed film and the underlying structure may vary depending on the type of substrate.

The processing system 49 creates test three-dimensional data by arranging a plurality of spectra along the polishing time. These plurality of spectra are those produced when the test substrate is polished. The processing system 49 selects, from the plurality of groups, one group including a training three-dimensional data that best matches the test three-dimensional data. Then, the processing system 49 constructs a film-thickness calculation model according to the machine learning algorithm, with use of a training data set including a combination of a plurality of training three-dimensional data belonging to the selected group and film thicknesses associated with these plurality of training three-dimensional data.

The above-mentioned reference substrates used for creating the training three-dimensional data may include a reference substrate having the same underlying structure, and may further include a reference substrate having a different underlying structure. The spectra generated from the reflected light from these various reference substrates can vary due to the difference in the underlying structure. As a result, the training three-dimensional data containing multiple spectra can also vary due to the difference in the underlying structure.

According to this embodiment, the training three-dimensional data that may vary depending on the difference in the underlying structure are divided into the plurality of groups according to the clustering algorithm. The processing system 49 selects, from the plurality of groups, one group including the training three-dimensional data that best matches the test three-dimensional data. A reference substrate used to create the training three-dimensional data belonging to the selected group is presumed to have the same or similar underlying structure as the test substrate. Therefore, the film-thickness calculation model constructed by using the training data set including such training three-dimensional data can accurately output a film thickness of the substrate W having the same structure as the test substrate.

In one embodiment, the processing system 49 may divide the plurality of training three-dimensional data shown in FIG. 19 into a plurality of groups, and may produce a plurality of film-thickness calculation models according to the machine learning using the training three-dimensional data belonging to the groups, respectively. Each film-thickness calculation model corresponding to each group can output a film thickness that reflects the difference in the underlying structure of the substrate. These plurality of film-thickness calculation models are stored in the memory 49a. In one example, the plurality of film-thickness calculation models are stored in a library constructed in the memory 49a. The processing system 49 selects, from the plurality of film-thickness calculation models, one film-thickness calculation model suitable for a substrate to be polished, and calculates a film thickness using the selected film-thickness calculation model. During polishing of the substrate, the processing system 49 may switch to another film-thickness calculation model that is more suitable for the substrate being polished.

A relationship between the input and the output of the film-thickness calculation model may be 1:1 or 1:plural, plural:1, or plural:plural. Examples of inputs and outputs of the film-thickness calculation model include the following.

Input: three-dimensional data
polishing operation parameters
environmental parameters
Output: film thickness
polishing process control value (control parameter)
predicted polishing time to the polishing end
program (for example, a program that describes a function to output polishing parameters and coefficients)
polishing recipe
pressing pressure on the substrate The training data set may include additional input data such as polishing operation parameters and environmental parameters as explanatory variables in addition to the training three-dimensional data. Examples of the polishing operation parameters include the rotation speed of the polishing table 3, the rotation speed of the polishing head 1, the pressing force applied by the polishing head 1 to the substrate W, and the like. Examples of the environmental parameters include the temperature of the polishing liquid supplied from the polishing-liquid supply nozzle 5 and the temperature of the polishing pad 2.

In addition to the film thickness, the training data set may further include additional output data such as polishing process control values (control parameters), predicted polishing time, program, polishing recipe, and pressing force on the substrate as objective variables. The predicted polishing time is a predicted time from a certain point during polishing to the polishing end point. The program is, for example, a program that describes a function for outputting polishing parameters and coefficients. The polishing recipe includes an operation flow of a polishing apparatus for polishing a substrate.

The film-thickness calculation model may include an input layer having neurons corresponding to the training three-dimensional data and the above-described additional input data, and an output layer having neurons corresponding to the film thickness and the above-described additional output data. The processing system 49 performs machine learning using a training data set including the training three-dimensional data, the film thickness, the additional input data, and the additional output data to construct a film-thickness calculation model. Specifically, the training three-dimensional data and the additional input data are input to the input layer of the film-thickness calculation model, and the parameters (weight, bias, etc.) of the film-thickness calculation model are adjusted so that the film thickness and the additional output data corresponding to the training three-dimensional data and the additional input data are output from the output layer. As a result of such machine learning, the film-thickness calculation model as a trained model is created. The film-thickness calculation model is stored in the memory 49a of the processing system 49.

Further, the processing system 49 inputs three-dimensional data and additional input data to the input layer of the film-thickness calculation model as a trained model during polishing of the substrate, and outputs a film thickness and additional output data from the output layer of the film-thickness calculation model.

According to this embodiment, the film-thickness calculation model can output not only the film thickness but also additional information such as the predicted polishing time and the polishing recipe. As a result, optimum operation of the polishing apparatus is achieved.

The previous description of embodiments is provided to enable a person skilled in the art to make and use the present invention. Moreover, various modifications to these embodiments will be readily apparent to those skilled in the art, and the generic principles and specific examples defined herein may be applied to other embodiments. Therefore, the present invention is not intended to be limited to the embodiments described herein but is to be accorded the widest scope as defined by limitation of the claims.

What is claimed is:

1. A polishing method comprising:
   polishing a surface of a substrate by pressing the substrate against a polishing pad on a rotating polishing table;
   producing a spectrum of reflected light from the surface of the substrate each time the polishing table makes one rotation;
   creating a three-dimensional data containing a plurality of spectra arranged along polishing time;
   converting a plurality of reference data into a plurality of reference images, the plurality of reference data including a plurality of reference spectra produced when a plurality of prepared reference substrates are polished;
   converting initial three-dimensional data into an initial two-dimensional image, the initial three-dimensional data being created at an initial stage of polishing of the substrate;
   selecting, from the plurality of reference images, a reference image including an image area that best matches the initial two-dimensional image;
   converting the three-dimensional data of the substrate into a two-dimensional image;
   determining a position of an image area in the selected reference image that best matches the two-dimensional image; and
   determining a film thickness of the substrate associated with the determined position.

2. A polishing apparatus comprising:
   a polishing table for supporting a polishing pad, the polishing table being rotatable;
   a polishing head configured to press a substrate against the polishing pad to polish a surface of the substrate;
   a sensor head located in the polishing table, the sensor head being configured to direct light to the surface of the substrate and receive reflected light from the surface of the substrate; and
   a processing system having a memory storing therein a program configured to cause the processing system to produce a spectrum of the reflected light, create a three-dimensional data containing a plurality of spectra arranged along polishing time, and determine a film thickness of the substrate based on the three-dimensional data,
   the processing system being configured to:
   convert a plurality of reference data into a plurality of reference images, the plurality of reference data including a plurality of reference spectra produced when a plurality of prepared reference substrates are polished;
   convert an initial three-dimensional data into an initial two-dimensional image, the initial three-dimensional data being created at an initial stage of polishing of the substrate;
   select, from the plurality of reference images, a reference image including an image area that best matches the initial two-dimensional image;
   convert the three-dimensional data of the substrate into a two-dimensional image;
   determine a position of an image area in the selected reference image that best matches the two-dimensional image; and
   determine the film thickness associated with the determined position.

* * * * *